US008423176B2

(12) United States Patent  
Ogi

(10) Patent No.: US 8,423,176 B2  
(45) Date of Patent: Apr. 16, 2013

(54) SUBSTRATE PROCESSING APPARATUS AND SUBSTRATE TRANSFER METHOD ADOPTED IN SUBSTRATE PROCESSING APPARATUS

(75) Inventor: Tatsuya Ogi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 39 days.

(21) Appl. No.: 13/233,728

(22) Filed: Sep. 15, 2011

(65) Prior Publication Data

US 2012/0004753 A1 Jan. 5, 2012

Related U.S. Application Data

(62) Division of application No. 11/289,316, filed on Nov. 30, 2005, now Pat. No. 8,078,311.

(60) Provisional application No. 60/663,262, filed on Mar. 21, 2005.

(30) Foreign Application Priority Data

Dec. 6, 2004 (JP) .................................. 2004-352796

(51) Int. Cl.
 *G06F 7/00* (2006.01)
(52) U.S. Cl.
 USPC ........................................................ 700/214
(58) Field of Classification Search .................. 700/213, 700/214, 218, 121, 228; 414/940, 217, 935
 See application file for complete search history.

(56) References Cited

U.S. PATENT DOCUMENTS

| 6,275,744 B1 | 8/2001 | Yoshida | |
| 2002/0192055 A1* | 12/2002 | Kobayachi et al. | 414/200 |
| 2003/0028282 A1* | 2/2003 | Oh | 700/213 |
| 2003/0195655 A1* | 10/2003 | Spano et al. | 700/237 |
| 2004/0029300 A1* | 2/2004 | Iijima et al. | 438/14 |
| 2004/0043513 A1* | 3/2004 | Ishizawa et al. | 438/1 |
| 2006/0228195 A1* | 10/2006 | Hayashida et al. | 414/217 |
| 2008/0019809 A1 | 1/2008 | Takano | |

FOREIGN PATENT DOCUMENTS

| JP | 11-102953 | 4/1999 |
| JP | 2002-237507 | 8/2002 |
| WO | WO 2006/057319 A1 | 6/2006 |

OTHER PUBLICATIONS

Office Action mailed Jul. 27, 2010, in Japanese Patent Application No. 2004-352796 (with partial English-language translation).

* cited by examiner

*Primary Examiner* — Ramya Burgess

(74) *Attorney, Agent, or Firm* — Rothwell, Figg, Ernst & Manbeck, P.C.

(57) ABSTRACT

In a substrate processing apparatus according to the present invention, wafer transfer timing with which wafers are to be transferred to individual processing chambers from a cassette container is determined in correspondence to each processing chamber, based upon the lengths of time required to process a single wafer in the processing chambers. Then, wafers are transferred from the cassette container in conformance to the transfer timing thus determined. By setting the wafer transfer timing with which wafers are transferred from the cassette container in coordination with the lengths of processing time at the individual processing chambers, the operation rates in the processing chambers are improved and ultimately, the throughput of the apparatus is improved.

6 Claims, 11 Drawing Sheets

PROCESSING CHAMBER P1 (200 SEC)

PROCESSING CHAMBER P2 (60 SEC)

PROCESSING CHAMBER P1 (200 SEC)

PROCESSING CHAMBER P2 (70 SEC)

PROCESSING CHAMBER P1 (200 SEC)

PROCESSING CHAMBER P2 (50 SEC)

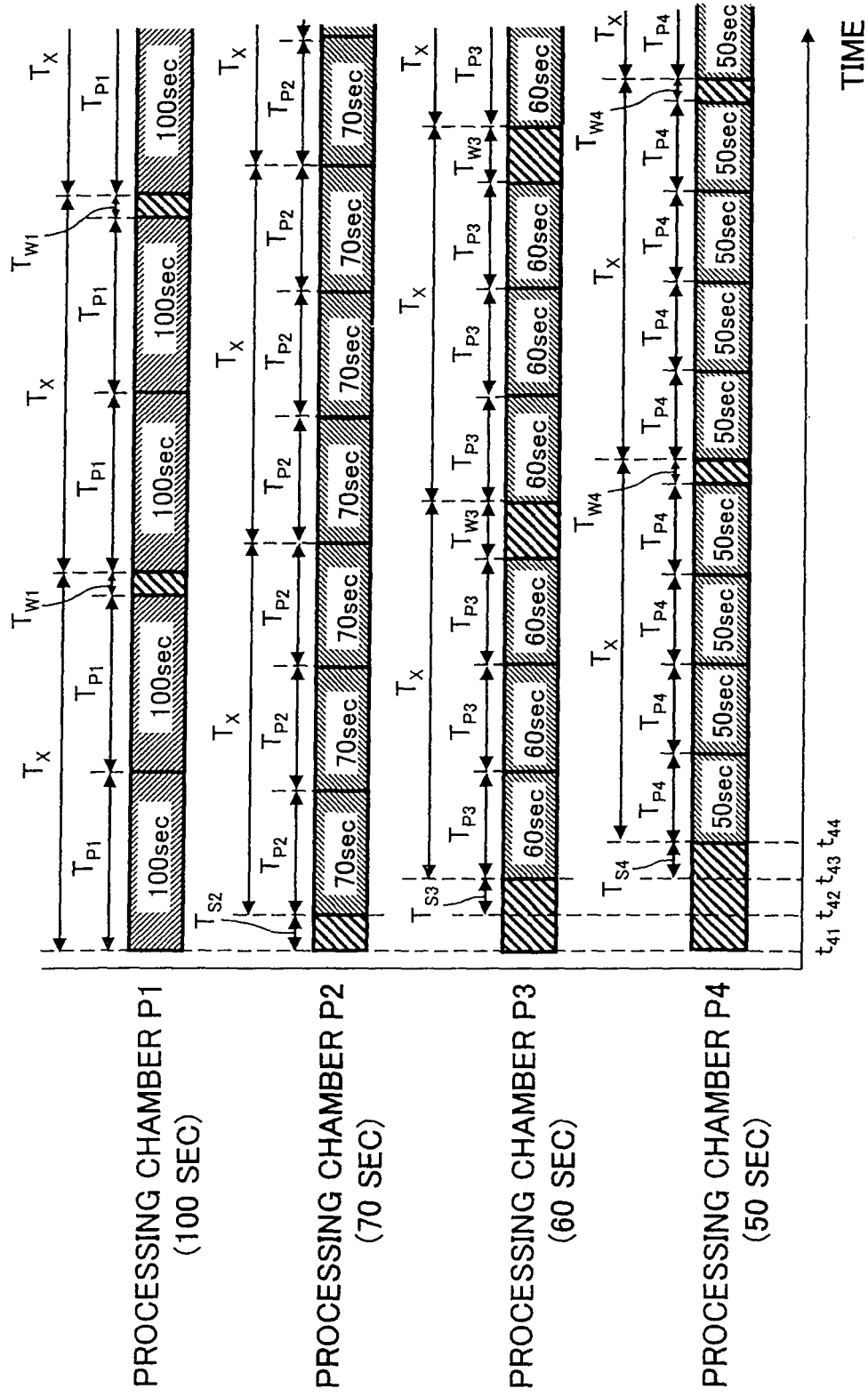

SUBSTRATE PROCESSING APPARATUS AND SUBSTRATE TRANSFER METHOD ADOPTED IN SUBSTRATE PROCESSING APPARATUS

CROSS REFERENCE TO RELATED APPLICATIONS

This is a Divisional Application of U.S. application Ser. No. 11/289,316, filed Nov. 30, 2005, which claims priority to Japanese Patent Application No. 2004-352796, filed Dec. 6, 2004 and U.S. Provisional Application No. 60/663,262 filed Mar. 21, 2005, the entire contents of which are hereby incorporated by reference.

FIELD OF THE INVENTION

The present invention relates to a substrate processing apparatus used to execute a specific type of processing on a substrate to be processed (to be referred to simply as substrate subsequently) such as a semiconductor wafer or a glass substrate (e.g., a liquid crystal substrate) and a substrate transfer method that may be adopted in the substrate processing apparatus.

BACKGROUND OF THE INVENTION

A substrate processing apparatus used for the purposes described above normally comprises a processing unit that includes a plurality of processing chambers where a specific type of processing is executed on substrates such as semiconductor wafers (hereafter may be simply referred to as "wafers") and a transfer unit connected to the processing unit via at least one load-lock chamber (see Japanese Laid Open Patent Publication No. 2002-237507 (reference literature 1), for instance).

The processing unit in a cluster tool-type substrate processing apparatus may be constituted by connecting with a high level of airtightness the plurality of processing chambers and load-lock chambers around a common transfer chamber assuming a polygonal shape, as shown in FIG. 6 of reference literature 1. Inside the common transfer chamber, a processing unit-side transfer mechanism constituted with a transfer arm and the like is disposed and wafers are transferred between the plurality of processing chambers and the load-lock chambers by the processing unit-side transfer mechanism. A transfer unit-side transfer mechanism also constituted with a transfer arm and the like is installed at the transfer unit, and wafers are transferred between a cassette container (substrate storage container) containing wafers and the load-lock chambers.

A wafer in the cassette container to undergo the specific type of processing in such a substrate processing apparatus is first transferred out of the cassette container by the transfer unit-side transfer mechanism at the transfer unit. The unprocessed wafer having been transferred out of the cassette container is then delivered to a positioning device (e.g., an orienter or a pre-alignment stage) disposed in the transfer unit for positioning, before it is transferred into the load-lock chamber. Once the unprocessed wafer is correctly positioned, it is transferred out of the positioning device and delivered into the load-lock chamber.

The unprocessed wafer having been transferred into the load-lock chamber is transferred out of the load-lock chamber by the processing unit-side transfer mechanism, is delivered into a processing chamber where it undergoes the specific type of processing. Once the processing is completed in the processing chamber, the processed wafer is transferred out of the processing chamber by the processing unit-side transfer mechanism and is returned to the load-lock chamber. The processed wafer having been returned to the load-lock chamber is delivered back into the cassette container by the transfer unit-side transfer mechanism.

Even while the processing is in progress in the individual processing chambers, unprocessed wafers are constantly transferred out of the cassette containers and are made to wait in standby in the common transfer chamber, the load-lock chambers, the positioning device and the like, since it is desirable to maintain a continuous flow of unprocessed wafers waiting in standby at closest possible positions to the processing chambers to assure maximum processing throughput from the processing chambers in the substrate processing apparatus. Once the processing on a given wafer is completed in a processing chamber, the processed wafer is immediately taken back into the cassette container and the unprocessed wafers having been waiting in standby are sequentially delivered so as to transfer the unprocessed wafer next in line immediately into the processing chamber.

In addition, when wafers are processed concurrently in the individual processing chambers, the optimal transfer timing with which wafers are to be transferred from the cassette container to undergo the processing in the processing chambers needs to be determined so as to improve the operation rate of each processing chamber. In the related art, the lengths of remaining processing time to elapse before the processing in progress in the individual processing chambers ends are compared and the unprocessed wafer in the cassette container designated to be processed in the processing chamber with the shortest remaining time is detected and transferred out of the cassette container. Since the processing chamber with the shortest remaining processing time becomes available to process the next wafer the soonest, the wafer to be processed in the processing chamber with the shortest remaining time is transferred out from the cassette container first and, as a result, the operation rate of each processing chamber is improved.

Different types of processing such as etching and film formation processing are often executed in the individual chambers. Even when a single type of processing is executed in the plurality of processing chambers, the processing is often executed under varying processing conditions. Thus, the lengths of time required to process a single wafer in the various processing chambers, the length of time to elapse after a wafer is delivered into a given processing chamber until the wafer processing is completed and the wafer is transferred out of the processing chamber so that the processing chamber becomes available for the next wafer, are not always uniform.

However, in the substrate processing apparatus in the related art described above, the lengths of remaining processing time to elapse before the processing in the individual processing chambers is completed alone are considered and the unprocessed wafer corresponding to the processing chamber with the shortest remaining time is first transferred out of the cassette container, without factoring in the varying lengths of time required to process wafers in the different processing chambers.

If the remaining processing time in a processing chamber where wafers are processed over a relatively long time is shorter than the remaining processing time in a processing chamber where the wafer processing is completed relatively quickly, a wafer corresponding to the processing chamber where the wafer processing takes longer is first transferred out of the cassette container and such a wafer may be kept waiting in standby at the common transfer chamber, the load-lock chamber or the positioning device, delaying the transfer of the wafer for the processing chamber with the shorter processing time out of the cassette container. Under such circumstances, the transfer system in the related art may become counterproductive and reduce both the operation rates of the individual processing chambers and the throughput of the substrate processing apparatus.

More specifically, let us consider processing requiring a greater length of time and processing that can be completed relatively quickly being executed concurrently in a processing chamber P1 and a processing chamber P2 respectively. If the remaining processing time at the processing chamber P1 where the processing takes a longer time is less than the remaining time at the processing chamber P2, the wafer $W_{P1}$ to undergo the processing in the processing chamber P1 will be the next wafer to be transferred out from the cassette container.

Under such circumstances, another wafer to undergo the processing in the processing chamber P1 is already waiting in standby in, for instance, the common transfer chamber. Thus, the wafer $W_{P1}$ transferred out of the cassette container upon completion of the processing in the processing chamber P1 cannot be processed immediately, since another wafer having already been waiting in standby at the common transfer chamber, the load-lock chamber, the positioning device or the like is next delivered to the processing chamber P1 to undergo the processing and the wafer $W_{P1}$ transferred out from the cassette container now needs to wait in standby at the common transfer chamber, the load-lock chamber, the positioning device or the like until the processing of the other wafer delivered into the processing chamber P1 ahead of the wafer $W_{P1}$ is completed.

In this situation, even if the processing at the processing chamber P2 requiring the shorter length of processing time is completed immediately afterwards and the processing chamber P2 becomes available, a wafer $W_{P2}$ to be processed in the processing chamber P2 where the processing is completed quickly cannot be transferred out of the cassette container. As a result, an unnecessary idle time occurs in the processing chamber P2 with the shorter processing time, which reduces the operation rate of the processing chamber P2 to lead to a reduction in the throughput of the substrate processing apparatus.

SUMMARY OF THE INVENTION

Accordingly, an object of the present invention, which has been completed by addressing the problems of the related art discussed above, is to provide a substrate processing apparatus and a substrate transfer method adopted in the substrate processing apparatus, with which substrates are transferred from a substrate storage container in coordination with the lengths of processing time required at a plurality of processing chambers where substrates are processed concurrently so as to improve the operation rates of the individual processing chambers and ultimately improve the throughput of the substrate processing apparatus.

The object described above is achieved in an aspect of the present invention, which provides a substrate processing apparatus comprising a processing unit that includes a plurality of processing chambers where substrates undergo a specific type of processing, a transfer unit connected to the processing unit, a transfer unit-side transfer mechanism disposed at the transfer unit, which transfers the substrates stored in a substrate storage container to the processing unit and a processing unit-side transfer mechanism disposed at the processing unit, which transfers the substrates having been transferred from the transfer unit into the processing chambers, characterized in that the substrate processing apparatus further includes a control means for transferring out the substrates from the substrate storage container with substrate transfer timing determined in correspondence to each of the processing chambers based upon the lengths of time required to process the substrates in the individual processing chambers so as to transfer the substrates from the substrate storage container into the individual processing chambers with optimal efficiency.

The object described above is achieved in another aspect of the present invention, which provides a substrate transfer method to be adopted in a substrate processing apparatus comprising a processing unit that includes a plurality of processing chambers where substrates undergo a specific type of processing, a transfer unit connected to the processing unit, a transfer unit-side transfer mechanism disposed at the transfer unit, which transfers the substrates stored in a substrate storage container to the processing unit and a processing unit-side transfer mechanism disposed at the processing unit, which transfers the substrates having been transferred from the transfer unit into the processing chambers, characterized in that the substrates are transferred from the substrate storage container in conformance to substrate transfer timing determined in correspondence to each of the processing chambers based upon the lengths of time required to process the substrates in the individual processing chambers so as to transfer the substrates from the substrate storage container into the individual processing chambers for processing with optimal efficiency.

In the apparatus or the method described above, substrates are transferred out from the substrate storage container in conformance to the transfer timing determined in advance in correspondence to each of the processing chambers based upon the lengths of time required to process substrates in the individual processing chamber, and thus, when substrates are processed concurrently in the various processing chambers, substrates can be transferred from the substrate storage container with the timing determined in coordination with the lengths of processing time required in the individual processing chambers. As a result, the operation rates at the processing chambers are improved and ultimately, the throughput of the substrate processing apparatus can be improved. For instance, substrates to be processed in a processing chamber where the processing time is significant may be transferred from the substrate storage container over a longer time interval, whereas substrates to be processed in a processing chamber where the processing can be completed quickly are transferred from the substrate storage container over a shorter time interval. As a result, the problem of the related art, i.e., the substrates intended for the processing in a processing chamber requiring a great length of processing time being held up in standby at the common transfer chamber, the load-lock chamber, the positioning device and the like over an extended time of time, delaying the transfer of a substrate intended for the processing in a processing chamber where the processing is completed quickly from the substrate storage container, can be eliminated, and improvements in both the operation rates at the individual processing chambers and the throughput of the substrate processing apparatus are achieved.

In addition, in the apparatus or the method described above, the substrate transfer timing may be indicated by a transfer ratio and a transfer frequency with which the substrates are transferred in correspondence to each processing chamber from the substrate storage container. The substrate transfer ratio in this context refers to the ratio of the number of substrates transferred to the specific processing chamber from the substrate storage container, whereas the substrate transfer frequency refers to a the frequency with which substrates are transferred to the processing chamber from the substrate storage container.

It is desirable to calculate the substrate transfer ratio based upon the maximum number of substrates that can be processed in the particular processing chamber during each time block corresponding to a reference transfer interval, the length of which is determined based upon the lengths of time required to process the substrates in the individual processing chambers, and to transfer the substrates to the specific processing chamber in the quantity indicated in the substrate transfer ratio during the reference transfer interval at a rate of one substrate per substrate processing time corresponding to the processing chamber.

By transferring substrates from the substrate storage container with the transfer timing determined as described above, the maximum number of substrates can be processed in a processing chamber while a single substrate is being processed in another processing chamber and thus, the lengths of processing-wait time corresponding to the individual processing chambers can be minimized to improve the operation rates of the processing chambers. In addition, a single substrate or a plurality of substrates are transferred from the substrate storage container during a time block matching a uniform reference transfer time interval in correspondence to each of the processing chambers, and thus, there is bound to be a time lag in the timing with which the substrates corresponding to the individual processing chambers are transferred from the substrate storage container due to the time lag occurring when the first substrates for the different processing chambers are transferred from the substrate storage container. Namely, the timing with which substrates intended for a given processing chamber are transferred in the timing with which substrates intended for another processing chamber are transferred never conflict with each other. As a result, no unnecessary wafer transfer wait time occurs in the individual processing chambers.

In the apparatus or the method described above, the substrate transfer ratio may be determined based upon the maximum number of substrates that can be processed in another processing chamber during a single time block corresponding to a reference transfer interval matching the length of processing time at the processing chamber where the processing is executed over the longest time of time among the individual processing chambers requiring varying lengths of processing time. Since the reference transfer interval can be determined with greater ease based upon the length of processing time at the processing chamber requiring the greatest length of processing time the substrate transfer ratio, too, can be calculated with greater expediency.

It is desirable to determine the reference transfer interval so as to minimize the length of wait time occurring during each time block corresponding to the reference transfer interval at each processing chamber in the apparatus or the method described above. Since the lengths of wait time at the individual processing chambers can be optimized in this manner, a further improvement in the throughput of the substrate transfer apparatus is achieved.

In yet another aspect of the present invention, the object described above is achieved by providing a substrate transfer method to be adopted in a substrate processing apparatus that processes a plurality of substrates concurrently in a plurality of processing chambers by sequentially transferring the substrates contained in a substrate storage container to the processing chambers where they are to undergo processing with specific transfer timing determined in advance, characterized in that the transfer timing determined through a step for calculating a transfer ratio with regard to the number of substrates transferred in correspondence to each of the processing chambers during a single time block matching a reference transfer interval, the length of which is determined based upon the lengths of processing time required to process the substrates in the individual processing chambers and a step for calculating a substrate transfer frequency for each processing chamber based upon the substrate transfer ratio.

In the method described above, the step for calculating the substrate transfer ratio may include a step for calculating the maximum number n of substrates that can be processed in a processing chamber during a single time block corresponding to a reference transfer interval matching the length of time required to process a single substrate in a processing chamber requiring the longest processing time among the individual processing chambers, a step for determining the length of wait time to occur in the other processing chamber during the time block corresponding to the reference transfer interval matching the length of time required to process a single substrate in the processing chamber requiring the longest processing time, a step for determining the length of wait time to occur in the processing chamber requiring the longest processing time during a time block corresponding to the reference transfer interval now matching the length of time required to process n+1 substrates in the other processing chamber and a step for comparing the lengths of wait time selecting the length of time required to process a single substrate in the processing chamber requiring the longest processing time as the reference transfer interval and setting the substrate transfer ratio to 1:n if the length of wait time at the processing chamber requiring the longest processing time is equal to or smaller than the length of wait time at the other processing chamber, and selecting the length of time required to process n+1 substrates in the other processing chamber as the reference transfer interval and setting the substrate transfer ratio to 1:n+1 if the length of wait time at the processing chamber requiring the longest processing time is greater than the length of wait time at the other processing chamber.

The step for determining the substrate transfer frequency may include a step for setting the substrate transfer frequency for the processing chamber so as to transfer a single substrate during a time block corresponding to the reference transfer interval and setting the substrate transfer frequency for the other processing chamber so as to transfer n substrates during a time block corresponding to the reference transfer interval at a rate of one substrate per processing time thereat if the substrate transfer ratio is 1:n, and for setting the substrate transfer frequency for the processing chamber requiring the longest processing time so as to transfer a single substrate during a time block corresponding to the reference transfer interval and setting the substrate transfer frequency for the other processing chamber so as to transfer n+1 substrates during a time block corresponding to the reference transfer interval at a rate of one substrate per processing time thereat if the substrate transfer ratio is 1:n+1.

Since the reference transfer interval determined as described above based upon the length of processing time at the processing chamber requiring the longest processing time can be readily calculated, the substrate transfer ratio, too, can be calculated with greater expedience. In addition, since the reference transfer interval is selected so as to minimize the length of wait time either at the processing chamber requiring the longest processing time or at the other processing chamber and the substrate transfer timing with which substrates are transferred from the substrate storage container (e.g., the substrate transfer ratio and the substrate transfer frequencies) is determined based upon the reference transfer interval, the lengths of wait time to occur at the individual processing chambers can be optimized, which, in turn, further improves the throughput of the substrate transfer apparatus.

Alternatively, the step for determining the substrate transfer ratio executed in the method described above may include a step for calculating the maximum number n of substrates that can be processed in another processing chamber during a single time block corresponding to a reference transfer interval matching the length of time required to process m substrates in a processing chamber requiring the longest processing time among the individual processing chambers, a step for determining the length of wait time to occur at the other processing chamber during the time block corresponding to the reference transfer interval matching the length of time required to process m substrates in the processing chamber requiring the longest processing time, a step for determining the length of wait time to occur in the processing chamber requiring the longest processing time during a time block corresponding to a reference transfer interval matching the length of time required to process n+1 substrates in the other processing chamber, a step for ascertaining values representing the maximum number n of substrates, the length of wait time at the other processing chamber and the length of wait time at the processing chamber requiring the longest processing time in correspondence to varying values of m and determining values for m and n that will minimize the length of wait time at the other processing chamber and the length of wait time at the processing chamber requiring the longest processing time and a step for comparing a length of wait time at the other processing chamber and the length of wait time at the processing chamber requiring the longest processing time in correspondence to the values determined for m and n, setting the reference transfer interval to the length of time required to process m substrates in the processing chamber requiring the longest processing time and setting the substrate transfer ratio to m:n+1 if the length of wait time at the processing chamber requiring the longest processing time is equal to or less than the length of wait time at the other processing chamber, and setting the reference transfer interval to the length of time required to process n+1 substrates in the other processing chamber and setting the substrate transfer ratio to m:n+1 if the length of wait time at the processing chamber requiring the longest processing time is greater than the length of wait time at the other processing chamber.

The step for determining the substrate transfer frequency in the method described above may include a step for setting the substrate transfer frequency for the processing chamber requiring the longest processing time so as to transfer m substrates during a time block corresponding to the reference transfer interval one substrate per processing time thereat and setting the substrate transfer frequency for the other processing chamber so as to transfer n substrates during a time block corresponding to the reference transfer interval at a rate of one substrate per processing time thereat if the substrate transfer ratio is m:n, and setting the substrate transfer frequency for the processing chamber requiring the longest processing time so as to transfer m substrates during a time block corresponding to the reference transfer interval at a rate of one substrate per processing time thereat and setting the substrate transfer frequency for the other processing chamber so as to transfer n+1 substrates during a time block corresponding to the reference transfer interval one substrate per processing time thereat if the substrate transfer ratio is m:n+1.

Since the reference transfer interval can be determined with ease based upon the length of time which is m times the length of time required to process a substrate in the processing chamber requiring the longest processing time, the substrate transfer ratio can be calculated with greater expedience. In addition, since the reference transfer interval is determined so as to minimize the length of wait time either at the processing chamber requiring the longest processing time or at the other processing chamber and the substrate transfer timing with which substrates are transferred from the substrate storage container (e.g., the substrate transfer ratio and the substrate transfer frequencies) is determined based upon the reference transfer interval, the lengths of wait time to occur at the individual processing chambers can be optimized, which, in turn, further improves the throughput of the substrate transfer apparatus.

BRIEF DESCRIPTION OF THE DRAWINGS

FIG. 11 shows wafer processing schedules that may be set in conjunction with four processing chambers.

DETAILED DESCRIPTION OF THE PREFERRED EMBODIMENTS

Figure 1:
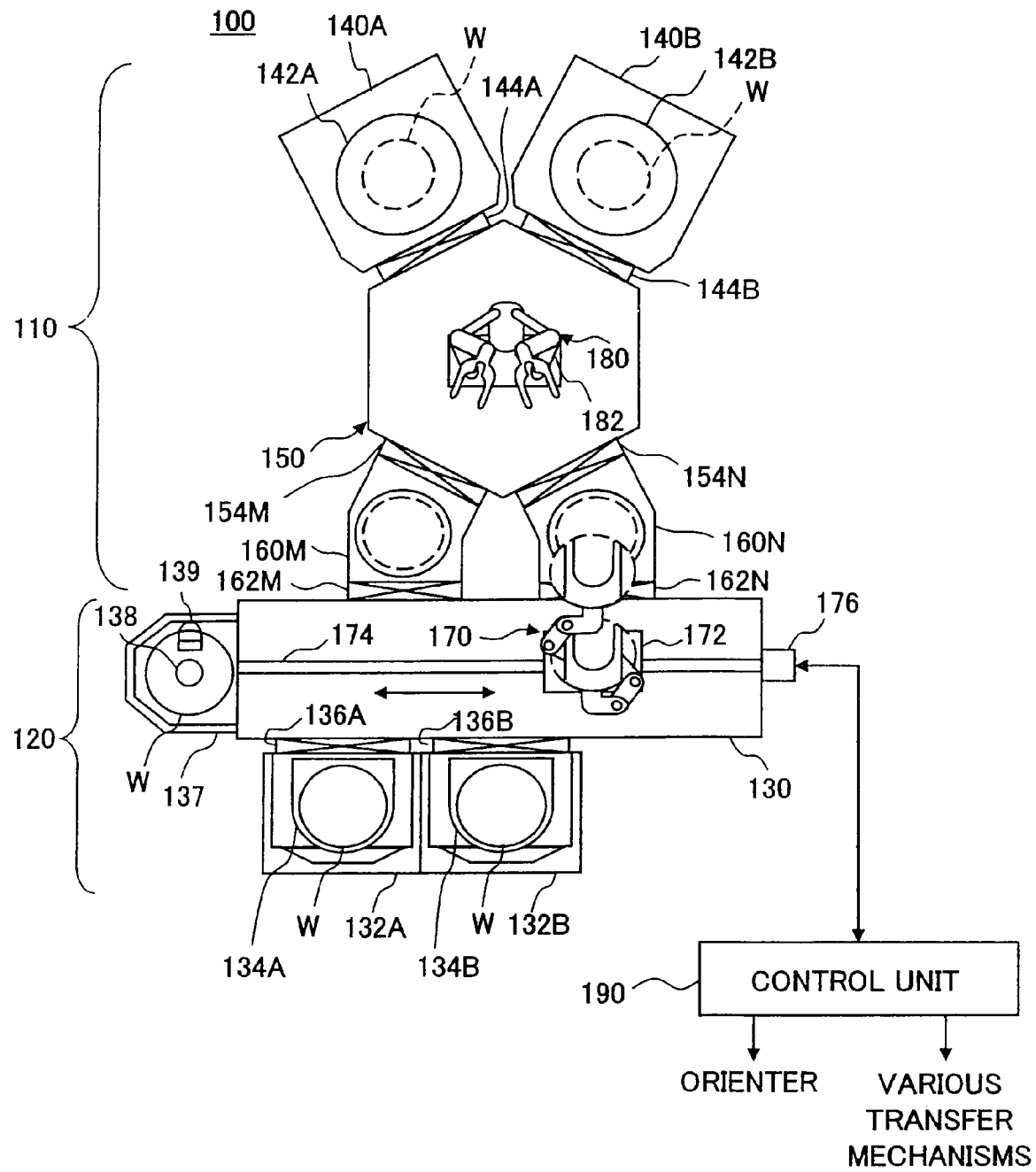
FIG. 1 presents a structural example adopted in the substrate processing apparatus achieved in an embodiment of the present invention.

The following is a detailed explanation of preferred embodiments of the present invention, given in reference to the attached drawings. It is to be noted that in the specification and the drawings, the same reference numerals are assigned to components having substantially identical functions and structural features to preclude the necessity for a repeated explanation thereof.

(Structural Example Adopted in Substrate Processing Apparatus)

First, the substrate processing apparatus achieved in an embodiment of the present invention is explained in reference to drawings. FIG. 1 schematically shows the structure adopted in the substrate processing apparatus in an embodiment of the present invention. The substrate processing apparatus 100 comprises a processing unit 110 where various types of processing such as film formation and etching are executed on substrates which may be, for instance, semiconductor wafers (hereafter may be simply referred to as "wafers") W and a transfer unit 120 that transfers the wafers W to/from the processing unit 110. The transfer unit 120 includes a common transfer chamber 130 used when transferring the wafers W.

The transfer chamber 130 at the transfer unit 120 is formed as a box with a substantially polygonal section, in which an inert gas such as $N_2$ gas or clean air is circulated. On one side of the transfer chamber 130 along the longer side of its substantially polygonal section, a plurality of cassette stages 132 (132A and 132B in this example) are disposed side-by-side. Cassette containers 134A and 134B both representing an example of the substrate storage container can be placed on the cassette stages 132A and 132B respectively.

The cassette containers 134A and 134B each has a capacity for housing up to, for instance, 25 wafers W stacked with uniform pitches. The cassette containers adopt a sealed structure with their inner space filled with, for instance, an $N_2$ gas atmosphere. The wafers W can be transferred between the transfer chamber 130 and the cassette containers 134A and 134B via gate valves 136A and 136B respectively.

In this embodiment, wafers to undergo processing in processing chambers 140A and 140B are respectively stored in the cassette containers 134A and 134B. However, as long as a specific type of wafer can be delivered to the correct processing chamber for processing, it is not strictly necessary to use the separate cassette containers 134A and 134B to store the wafers to undergo the processing in the individual processing chambers 140A and 140B. For instance, wafers to be processed in the processing chambers 140A and 140B may be stored together in either one of or both of the cassette containers 134A and 134B. In addition, while FIG. 1 shows the two cassette containers 134A and 134B placed on the cassette stages 132A and 132B respectively in a one-on-one correspondence, the quantities of the cassette stages and cassette containers are not limited to this example and their quantities may be three or more each.

At an end of the transfer chamber 130, i.e., on one side of its substantially polygonal section along the shorter sides, an orienter (pre-alignment stage) 137 to function as a positioning device, which includes a rotating stage 138 and an optical sensor 139 for optically detecting the edge of a wafer W disposed therein, is installed. This orienter 137 aligns the wafer W by detecting an orientation flat, a notch or the like in the wafer W.

The processing unit 110 includes processing chambers 140 (140A and 140B) where specific types of processing such as film formation (e.g., plasma CVD processing) or etching (e.g., plasma etching process) is executed on wafers. A single type of processing may be executed in both processing chambers 140A and 140B or different types of processing may be executed in the individual processing chambers 140A and 140B. The specific type of processing is executed in each of the processing chambers 140A and 140B on wafers based upon information (a process recipe) indicating specific processing steps to be executed during an etching process or the like, which is stored in advance in a memory or the like at a control unit. The specific processing chamber where a given wafer is to undergo the processing may be determined in reference to, for instance, the process recipe. The processing unit 110 also includes a common transfer chamber 150 through which wafers are transferred into/out of the processing chambers 140A and 140B. The common transfer chamber 150 is formed in a polygonal (e.g., hexagonal) shape and the processing chambers 140A and 140B are disposed at its perimeter respectively via gate valves 144A and 144B.

A single type of processing or different types of processing can be executed on the wafers W in the processing chambers 140A and 140B. Stages 142A and 142B on which the wafers W are to be placed are respectively disposed inside the processing chambers 140A and 140B. It is to be noted that the quantity of the processing chambers 140 is not limited to two, and the processing unit may include a greater number of processing chambers.

At the perimeter of the common transfer chamber 150, first and second load-lock chambers 160M and 160N representing an example of a vacuum preparation chamber connecting with the transfer unit 120 are disposed. More specifically, the front ends of the first and second load-lock chambers 160M and 160N are connected to the perimeter of the common transfer chamber 150 respectively via gate valves (vacuum-side gate valves) 154M and 154N, whereas the base ends of the first and second load-lock chambers 160M and 160N are connected to the other side of the transfer chamber 130 along the longer side of its substantially polygonal section respectively via gate valves (atmosphere-side gate valves) 162M and 162N.

The first and second load-lock chambers 160M and 160N can be evacuated so that wafers W held temporarily therein can be passed on to the subsequent stages after pressure adjustment. It is to be noted that the load-lock chambers 160M and 160N may each further include a cooling mechanism or a heating mechanism.

As described above, the passages between the common transfer chamber 150 and the individual processing chambers 140A and 140B and the passages between the common transfer chamber 150 and the individual load-lock chambers 160M and 160N can be opened/closed while assuring a high level of airtightness, thereby achieving a cluster tool structure that allows communication with the common transfer chamber 150 as necessary. In addition, the passages between the transfer chamber 130 and the first and second load-lock chambers 160M and 160N, too, can be opened/closed while assuring airtightness.

Inside the common transfer chamber 150, a processing unit-side transfer mechanism 180 constituted with an articulated arm capable of flexing, moving up/down and rotating, for instance, is disposed. This processing unit-side transfer mechanism 180 is able to access the load-lock chambers 160M and 160N and the processing chambers 140A and 140B. For instance, a wafer transferred into either the load-lock chamber 160M or the load-lock chamber 160N is then transferred into the corresponding processing chamber 140A or 140B where the wafer is to undergo the processing by the processing unit-side transfer mechanism 180.

The processing unit-side transfer mechanism 180 is constituted with a double arm mechanism that includes two end-effectors and thus is capable of handling two wafers at a time. This means that when it delivers a wafer to a given processing chamber 140A or 140B, it is able to replace a processed wafer with an unprocessed wafer. It is to be noted that the number of end-effectors included in the processing unit-side transfer mechanism 180 does not need to be two, and a single arm mechanism with a single end-effector may instead be used.

Inside the transfer chamber 130, a transfer unit-side transfer mechanism 170 that transfers a wafer W along its longer side (along the direction indicated by the arrow in FIG. 1) is disposed. A base 172 at which the transfer unit-side transfer mechanism 170 is locked is slidably supported on a guide rail 174 extending over the central area inside the transfer chamber 130 along the longer side. A mover and a stator of a linear motor are respectively disposed at the base 172 and the guide rail 174. A linear motor drive mechanism 176 used to drive the linear motor is disposed at an end of the guide rail 174. A control unit 190 is connected to the linear motor drive mechanism 176. Thus, the linear motor drive mechanism 176 is driven in response to a control signal provided by the control unit 190 to move the transfer unit-side transfer mechanism 170 along the direction indicated by the arrow together with the base 172 on the guide rail 174.

As is the processing unit-side transfer mechanism 180, the transfer unit-side transfer mechanism 170 is constituted with a double arm mechanism that includes two end-effectors so as to allow it to handle two wafers at a time. Thus, when transferring a wafer to/from the cassette container 134, the orienter 137, the load-lock chamber 160M or 160N, it is able to exchange wafers. It is to be noted that the number of end-effectors included in the transfer unit-side transfer mechanism 170 does not need to be two and a single arm mechanism with a single end-effector may be used instead.

The substrate processing apparatus 100 includes the control unit 190 which controls the operations of the entire substrate processing apparatus including processing for determining the transfer timing with which wafers are to be transferred from the cassette containers 134, as explained later, and control for actually transferring the wafers from the cassette containers 134 with the wafer transfer timing having been determined, as well as control of the individual transfer mechanisms 170 and 180, the individual gate valves 136, 144, 154 and 162, the orienter 137 and the like. The control unit 190 may include, for instance, a microcomputer constituting the main component of the control unit 190 and a memory for storing various types of data.

(Operations at the Substrate Processing Apparatus)

Next, the operations of the substrate processing apparatus structured as described above are explained. A wafer W transferred from the cassette container 134A or 134B by the transfer unit-side transfer mechanism 170 is carried to the orienter 137 where it is placed on the rotating stage 138 for alignment. The aligned wafer is then transferred out of the orienter 137 and is transferred into the load-lock chamber 160M or 160N. If a processed wafer is present in the load-lock chamber 160M or 160N at this time, the processed wafer is first taken out and then the unprocessed wafer is carried into the load-lock chamber.

The wafer having been carried into the load-lock chamber 160M or 160N is transferred out of the load-lock chamber 160M or 160N by the processing unit-side transfer mechanism 180, and is transferred into the processing chamber 140A or 140B where it is to undergo the specific type of processing. Once the processing is completed in the processing chamber 140A or 140B, the processed wafer is transferred out of the processing chamber 140A or 140B by the processing unit-side transfer mechanism 180 and is returned to the corresponding load-lock chamber 160M or 160N. The processed wafer having been returned to the load-lock chamber 160M or 160N is carried back into the cassette container 134A or 134B by the transfer unit-side transfer mechanism 170.

Since the throughput of the processing in the processing chamber 140A or 140B can be improved by keeping an unprocessed wafer waiting in standby at the closest possible position to the processing chamber, unprocessed wafers are continuously transferred out of the cassette container 134A or 134B even while the processing in the processing chamber 140A or 140B is in progress, and these unprocessed wafers are made to wait in standby at the common transfer chamber 150, the load-lock chamber 160M or 160N, the orienter 137 and the like. Once the processing of a given wafer is completed in the processing chamber 140A or 140B, the processed wafer is immediately returned to the cassette container 134A or 134B, the unprocessed wafers waiting in standby are sequentially advanced and the next unprocessed wafer to undergo processing, which has been waiting in standby in the common transfer chamber 150, is immediately transferred into the processing chamber 140A or 140B.

When wafers are to be processed concurrently in the individual processing chambers 140A and 140B of the substrate processing apparatus 100, the optimal transfer timing with which wafers are to be transferred from the cassette containers 134A and 134B to undergo the processing at the processing chambers 140A and 140B needs to be determined so as to assure high operation rates for the processing chambers 140A or 140B. The substrate transfer method achieved in the embodiment, which includes processing for determining such transfer timing, is now explained.

(Method for Transferring Substrates in the Substrate Processing Apparatus)

The substrate transfer method achieved in the embodiment is characterized in that wafers are transferred from the individual cassette containers 134 by the transfer unit-side transfer mechanism 170 with the wafer transfer timing determined in advance based upon the lengths of processing time required in the individual processing chambers. Since the wafers are transferred from each cassette container 134 with the wafer transfer timing determined in coordination with the lengths of processing time required at the processing chambers through this method, unnecessary wait times due to the disparity between the lengths of processing time required at the individual processing chambers do not occur even when wafers are continuously processed at the same time in a plurality of processing chambers requiring varying lengths of processing time. As a result, the throughput of the substrate processing apparatus is improved. It is to be noted that the expression "the length of processing time" required at each processing chamber refers to the length of time required to process a single wafer (including, for instance, the process time), which may extend from, for instance, a time point at which a given wafer is carried into the processing chamber until the wafer is processed and transferred out, leaving the processing chamber available for the processing of the next wafer.

The wafer transfer timing may be determined based upon, for instance, a wafer transfer ratio and wafer transfer frequencies. The expression "wafer transfer ratio" in this context refers to the ratio of the numbers of wafers transferred to the individual processing chambers from the cassette containers 134, and the expression "wafer transfer frequency" refers to the frequency with which wafers are transferred to each processing chamber from the corresponding cassette container 134. For instance, when P1 represents the processing chamber requiring the longest processing time to process a single wafer with Pk (k=2, 3 . . . ) representing another processing chamber, $T_{P1}$ represents the length of time required to process a single wafer in the processing chamber P1 with $T_{Pk}$ representing the length of time required to process a single wafer in the other processing chamber Pk and $W_{P1}$ represents wafers processed in the processing chamber P1 with $W_{Pk}$ representing wafers processed in the other processing chamber Pk, the "wafer transfer ratio" is the ratio of the numbers of wafers $W_{P1}$ and wafers $W_{Pk}$ transferred from the cassette containers 134 in correspondence to the varying lengths of processing time $T_{P1}$ and $T_{Pk}$ required at the individual processing chambers P1 and Pk. In addition, the "wafer transfer frequencies" are the frequencies with which the wafers $W_{P1}$ and $W_{Pk}$ are transferred from the corresponding cassette containers 134 at the wafer transfer ratio described above.

It is to be noted that if the substrate processing apparatus includes three or more processing chambers, optimal wafer transfer timing should be determined based upon the individual relationships of the other processing chambers Pk to the processing chamber P1 requiring the longest wafer processing time. For instance, if the substrate processing apparatus includes three processing chambers P1, P2 and P3, the transfer timing for the wafers $W_{P1}$ and $W_{P2}$ should be determined based upon the relationship between the transfer chamber P1 and the transfer chamber P2. The transfer timing for the wafer $W_{P3}$ should be determined based upon the relationship between the processing chamber P1 and the processing chamber P3. The wafer transfer timing is determined as described above based upon the relationships of the other processing chambers Pk to the processing chamber P1 requiring the longest wafer processing time, since the optimal wafer transfer timing can be determined for wafers to undergo the processing in the individual processing chambers with greater ease in reference to the longest processing time $T_{P1}$.

Next, the method adopted to determine the wafer transfer timing is explained. The wafer transfer timing may be determined as described below in correspondence to the lengths of processing time $T_{P1}$ and $T_{Pk}$ at the individual processing chambers P1 and Pk. An explanation is given on an example in which the substrate processing apparatus 100 includes two processing chambers, as shown in FIG. 1. Of the two processing chambers 140A and 140B at the substrate processing apparatus 100, the processing chamber requiring the longest processing time is designated as P1 and the other processing chamber is designated as P2.

Assuming that the ratio of the lengths of processing time $T_{P1}$ and $T_{P2}$ at the processing chambers P1 and P2 is 2:1, two wafers $W_{P2}$ can be processed in the processing chamber P2 while processing a single wafer $W_{P1}$ in the processing chamber P1 over its processing time $T_{P1}$. Accordingly, the wafer transfer ratio is set to 1:2. Since the next wafer is processed after the processing at a given processing chamber P1 or P2 is completed, it is assumed that wafers $W_{P1}$ and $W_{P2}$ are respectively transferred over time intervals corresponding to the respective processing time lengths $T_{P1}$ and $T_{P2}$.

As a result, wafers $W_{P1}$ and wafers $W_{P2}$ to be processed in the individual processing chambers P1 and P2 are transferred with transfer frequencies respectively corresponding to the processing time lengths $T_{P1}$ and $T_{P2}$ each at the rate of one wafer for processing time $T_{P1}$ or $T_{P2}$. Since the processing time length $T_{P1}$ is twice the length of processing time $T_{P2}$, two wafers $W_{P2}$ are transferred to undergo the processing in the processing chamber P2 in correspondence to every wafer $W_{P1}$ transferred to undergo processing in the processing chamber P1.

As described above, the wafer transfer timing with which wafers are transferred from the cassette containers 134 is determined in correspondence to the lengths of processing time $T_{P1}$ and $T_{Pk}$ required at the individual processing chambers P1 and Pk in the embodiment, which allows a wafer $W_{P1}$ to be processed in the processing chamber P1 requiring the longer processing time to be transferred from the cassette container 134 over a longer time interval corresponding to the processing time $T_{P1}$ and wafers $W_{Pk}$, to be processed in the processing chamber Pk where that processing is completed quickly to be transferred from the cassette container 134 over a shorter time interval corresponding to the processing time $T_{Pk}$. As a result, the problem of wafers $W_{P1}$ to undergo the processing in the processing chamber P1 requiring the longer processing time being kept in standby at the common transfer chamber 150, the load-lock chamber 160M or 160N, the orienter 137 and the like over an extended time of time, delaying the transfer of wafers $W_{Pk}$ for the processing chamber Pk with the shorter processing time from the cassette container 134, as is likely to occur in the related art, is eliminated and consequently, improvements are achieved in both the operation rates of the individual processing chambers P1 and Pk and the throughput of the substrate processing apparatus.

Since the substrate processing apparatus includes only a single transfer unit-side transfer mechanism 170, a time lag $T_{S2}$ corresponding to the operating cycle of the transfer unit-side transfer mechanism 170, which elapses between the transfer start time point $t_{11}$ at which a first wafer $W_{P1}$ is transferred to be processed in the processing chamber P1 and a transfer start time point $t_{12}$ at which a first wafer $W_{P2}$ is transferred to be processed in the other processing chamber P2, is bound to occur as illustrated in FIG. 5 in the substrate processing apparatus 100 having two processing chambers shown in FIG. 1. The operating cycle of the transfer unit-side transfer mechanism 170 may include, for instance, the following sequence of operations. First, a wafer is transferred from the cassette container 134 with the transfer unit-side transfer mechanism 170 and is carried to the orienter 137. Then, the transfer unit-side transfer mechanism 170 accesses the orienter 137 and exchanges the wafer with an aligned wafer. Next, the aligned wafer is transferred toward the load-lock chamber 160N or 160M where the aligned wafer is exchanged with a processed wafer. Finally, the processed wafer is carried back to the cassette container 134. In the example presented in FIG. 5, the length of time required to execute the sequence of operations, i.e., the time lag $T_{S2}$ to elapse between the transfer start time points, is 20 sec.

Furthermore, since the transfer frequency with which a single wafer $W_{P1}$ is transferred to be processed in the processing chamber P1 is equal to the transfer frequency with which two wafers $W_{P2}$ are transferred to undergo the processing in the processing chamber P2, the transfer interval blocks corresponding to the individual processing chambers are always offset from each other by the extent corresponding to the time lag $T_{Sk}$ between the transfer start time points. For this reason, the timing with which wafers $W_{P1}$ are transferred from the cassette container 134 and the timing with which the wafers $W_{P2}$ are transferred from the cassette container 134 never coincide. Accordingly, as long as the wafers $W_{P1}$ and $W_{Pk}$ are transferred from the cassette containers 134 with such wafer transfer timing, no unnecessary wait times attributable to wafer transfer delays occur at the processing chambers P1 and P2.

If the length of processing time $T_{P1}$ at the processing chamber P1 is exactly an integral multiple (e.g., the value obtained by multiplying by n) of the length of processing time $T_{Pk}$ at the processing chamber Pk as described above the transfer interval block during which a single wafer $W_{P1}$ to be processed at the processing chamber P1 is transferred and the transfer interval block over which the integral multiple (e.g., n) wafers $W_{Pk}$ are transferred to be processed at the processing chamber Pk extend over equal lengths of time, and for this reason, these transfer interval blocks always occur asynchronously by the extent corresponding to the time lag $T_{Sk}$ between the transfer start time points. Consequently, no unnecessary wait times attributable to delayed wafer transfers occur at the individual processing chambers P1 and Pk. It is to be noted that the wafer transfer timing should be set under these circumstances so as to transfer the wafers $W_{P1}$ to be processed at the processing chamber P1 with a wafer transfer frequency with which a single wafer $W_{P1}$ is transferred in correspondence to each processing time extending over the time length $T_{P1}$ and to transfer the wafers $W_{Pk}$ to be processed at the processing chamber Pk with a wafer transfer frequency with which a single wafer $W_{Pk}$ is transferred in correspondence to each processing time extending over the time length $T_{Pk}$, and the wafer transfer ratio of the wafers $W_{P1}$ and $W_{Pk}$ is selected directly based upon the wafer transfer frequencies thus determined.

However, in the wafer processing in most practical applications, the length of processing time $T_{P1}$ at the processing chamber P1 is not exactly an integral multiple of the length of processing time $T_{Pk}$ at the processing chamber Pk. In such case, even though there is an initial time lag between the transfer start time points at which the first wafers $W_{P1}$ and $W_{Pk}$ are transferred as described above, the wafers $W_{P1}$ and $W_{Pk}$ are transferred with different transfer frequencies and thus, the transfer timing with which wafers $W_{P1}$ are transferred from the cassette container 134 and the transfer timing with which wafers $W_{Pk}$ are transferred from the cassette container 134 may eventually become synchronous. In such a case, either a wafer $W_{P1}$ or a wafer $W_{Pk}$ will have to be kept waiting before it is transferred and, as a result, a wait time occurs before the processing in either the processing chamber P1 or the processing chamber Pk can be executed, which reduces the throughput of the substrate transfer apparatus.

Accordingly, the present invention is characterized in that the transfer timing is determined so that a single wafer $W_{P1}$ and a plurality of wafers $W_{Pk}$ are transferred from the cassette containers 134 during transfer time blocks both equal to a reference transfer interval Tx without creating any wafer transfer wait times when transferring the wafers $W_{P1}$ and $W_{Pk}$ from the cassette containers 134.

In more specific terms, based upon the lengths of processing time $T_{P1}$ and $T_{Pk}$ corresponding to the individual processing chambers P1 and Pk, the reference transfer interval Tx to be used for reference when transferring the wafers $W_{P1}$ and $W_{Pk}$ from the cassette containers 134 is first determined. Then, the maximum numbers m and n of wafers $W_{P1}$ and $W_{Pk}$ that can be processed during a time block extending over the reference transfer interval Tx are individually determined.

The wafer transfer timing selected in this situation may be indicated with the wafer transfer ratio m:n of the wafers $W_{P1}$ and $W_{Pk}$ and the wafer transfer frequencies for the wafers $W_{P1}$ and $W_{Pk}$ respectively matching the corresponding lengths of processing time $T_{P1}$ and $T_{Pk}$. This means that m wafers $W_{P1}$ are transferred during a time block corresponding to the reference transfer interval Tx to be processed at the processing chamber P1, with a single wafer $W_{P1}$ transferred from the cassette container 134 in correspondence to each processing time $T_{P1}$, whereas n wafers $W_{Pk}$ are transferred during a time block corresponding to the reference transfer interval Tx extending over the same length of time to be processed at the processing chamber Pk, with a single wafer $W_{Pk}$ transferred from the cassette container 134 in correspondence to each processing time $T_{Pk}$. The wafers $W_{P1}$ and $W_{Pk}$ may be transferred either continuously or intermittently, as long as m wafers $W_{P1}$ are transferred out during the time block extending over the length of reference transfer interval Tx at the rate of a single wafer per processing time $T_{P1}$ and n wafers $W_{Pk}$ are transferred out during the time block extending over the same length of reference transfer interval Tx at the rate of a single wafer $W_{P2}$ transferred per processing time $T_{Pk}$.

As described above, when the wafers $W_{P1}$ and $W_{Pk}$ are processed concurrently in the processing chambers P1 and Pk, the wafer transfer timing with which the wafers are transferred from the cassette containers 134 can be coordinated with the lengths of processing time $T_{P1}$ and $T_{Pk}$ at the processing chambers P1 and Pk. With the wafers transferred with the timing described above, the maximum number of wafers $W_{Pk}$ that can be processed in the other processing chamber Pk while a single wafer $W_{P1}$ is processed in the processing chamber P1, which reduces the lengths of processing-wait time at the processing chambers P1 and Pk and thus improves the operation rates of the individual processing chambers. As a result, the throughput of the substrate processing apparatus is improved.

In addition, the wafers $W_{P1}$ and $W_{Pk}$ are transferred from the cassette containers 134 at the rate of one wafer or a specific number of wafers over time blocks matching the uniform reference transfer time interval Tx, and thus, there is bound to be a time lag $T_{Sk}$ in the timing with which the wafers corresponding to the individual processing chambers are transferred from the cassette containers 134 due to the time lag occurring when the first substrates for the different processing chambers P1 and Pk are transferred from the cassette containers. As a result, no unnecessary wafer transfer wait time occurs in the individual processing chambers.

In addition, the lengths of remaining time calculated by subtracting the lengths of time required to process m wafers $W_{P1}$ and n wafers $W_{Pk}$ from the same length of time corresponding to the reference transfer interval Tx respectively constitute the wait times to elapse in the processing chambers Pk and P1 during the time blocks matching the reference transfer interval Tx. Accordingly, it is desirable to determine the reference transfer interval Tx so as to minimize these wait times. For instance, by setting $T_{P1}$·m obtained by multiplying the processing time $T_{P1}$ at the processing chamber P1 by m as the reference transfer interval Tx, the wait time can be completely eliminated in the processing chamber P1, whereas by setting $T_{Pk}$·n or $T_{Pk}$·(n+1) obtained by multiplying the processing time $T_{Pk}$ by (n+1) as the reference transfer interval Tx, the wait time can be eliminated altogether at the processing chamber Pk.

The reference transfer interval Tx is determined as described above so as to minimize the wait time either at the processing chamber P1 or at the processing chamber P2, based upon the combination of the specific lengths of processing time $T_{P1}$ and $T_{P2}$ at the processing chambers P1 and P2. Then, the wafer transfer timing with which wafers are transferred from the cassette containers 134, indicated with, for instance, the wafer transfer ratio and the wafer transfer frequencies is then determined based upon the reference transfer interval Tx. As a result, the lengths of wait time at the processing chambers P1 and P2 can be optimized, which further improves the throughput of the substrate transfer apparatus. It is to be noted that the method for determining the wafer transfer timing can be adopted equally effectively regardless of whether or not the length of processing time $T_{P1}$ at the processing chamber P1 is exactly an integral multiple of the length of processing time $T_{Pk}$ at the processing chamber Pk.

It is to be noted that if the substrate processing apparatus includes three or more processing chambers, the wafer transfer timing should be determined based upon the relationship of each processing chamber Pk to the processing chamber P1 requiring the longest wafer processing time. In this situation, too, the transfer timing should be determined in relation to the uniform reference transfer interval Tx. In other words, once the reference transfer interval Tx is first determined while determining the wafer transfer timing in correspondence to the transfer chamber P2 among all the other processing chambers, the wafer transfer timing is then determined for all the rest of the processing chambers P3, P4 . . . $Pk_{end}$ by using the reference transfer interval Tx having been determined. It is to be noted that the length of wait time may be ascertained in correspondence to each of the other processing chambers Pk based upon its relationship with the processing chamber P1 and then, the reference transfer interval Tx may be calculated so as to minimize the length of wait time.

(Specific Example of Processing for Determining Wafer Transfer Timing)

Figure 2:
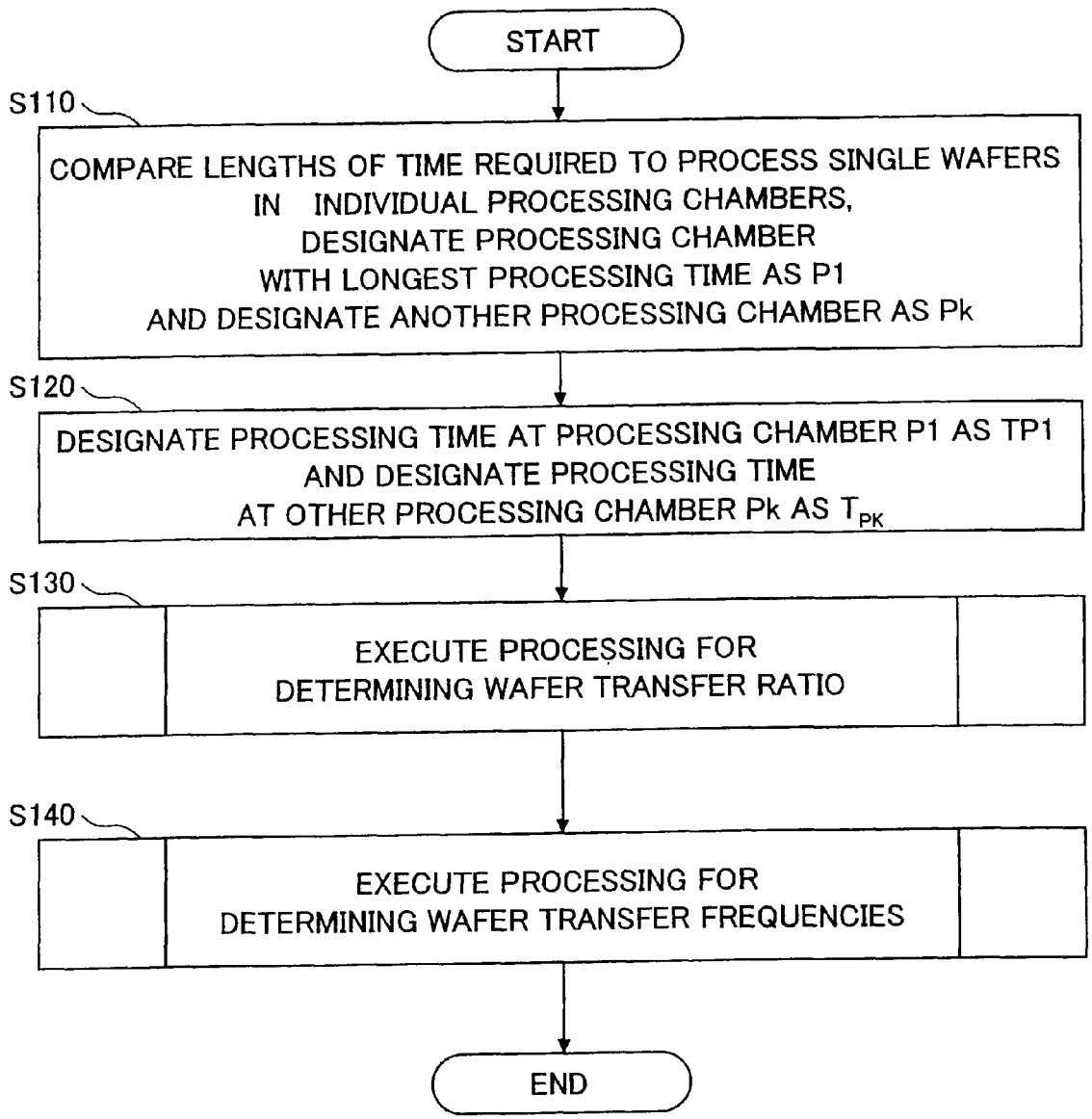
FIG. 2 presents a flowchart of the processing executed to determine the wafer transfer timing in the embodiment.

Next, a specific example of the processing executed to determine the wafer transfer timing as described above is explained in reference to a drawing. FIG. 2 presents a flowchart of the processing executed in the embodiment to determine the wafer transfer timing. It is to be noted that the processing for determining the wafer transfer timing may be executed in conformance to, for instance, a specific program by the control unit 190. Such a program may be preinstalled in the memory at the control unit 190 or in a storage medium such as a hard disk device of an external host apparatus connected to the control unit 190. In the latter case, the control unit 190 executes the program read from the recording medium.

The wafer transfer timing is determined by first comparing the lengths of time required to process wafers in the individual processing chambers, letting P1 represent the processing chamber requiring the longest processing time per wafer and letting Pk ($k=2, 3, \ldots k_{end}$) represent another processing chamber in step S110, as shown in FIG. 2. $k_{end}$ represents a value matching the number of processing chambers included in the substrate processing apparatus 100. For instance, the substrate processing apparatus 100 in FIG. 1 includes two processing chambers 140A and 140B and, accordingly, the processing chamber 140A requiring a longer processing time per wafer is referred to as the processing chamber P1 and the processing chamber 140B is referred to as the processing chamber P2.

Next, in step S120, the length of time required to process a single wafer at the processing chamber P1 is designated as $T_{P1}$ and the length of time required to process a single wafer in the other processing chamber Pk is designated as $T_{Pk}$. It is to be noted that reference codes P1 through Pk ($k=2, 3, \ldots k_{end}$) should be assigned in the order which places the processing chamber requiring the longest processing time ahead. For instance, if the substrate processing apparatus includes three processing chambers, the three processing chambers should be assigned with reference codes P1, P2 and P3, with P1 assigned to the processing chamber requiring the longest processing time per wafer, P2 assigned to the processing chamber requiring the second longest processing time per wafer and P3 assigned to the processing chamber requiring the least processing time per wafer.

Figure 3:
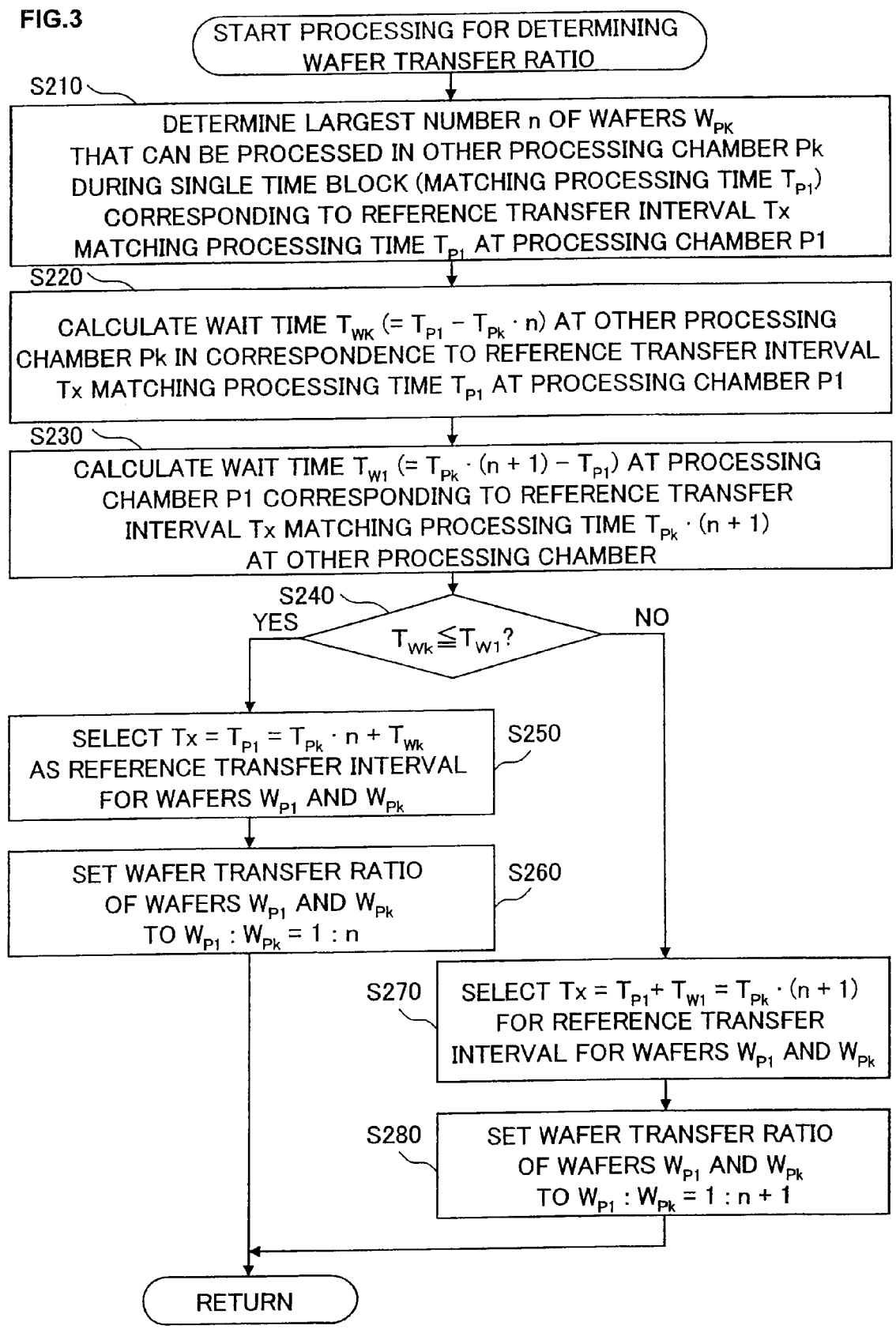
FIG. 3 presents a flowchart of a specific example of the processing executed to determine the wafer transfer ratio in FIG. 2.
Figure 4:
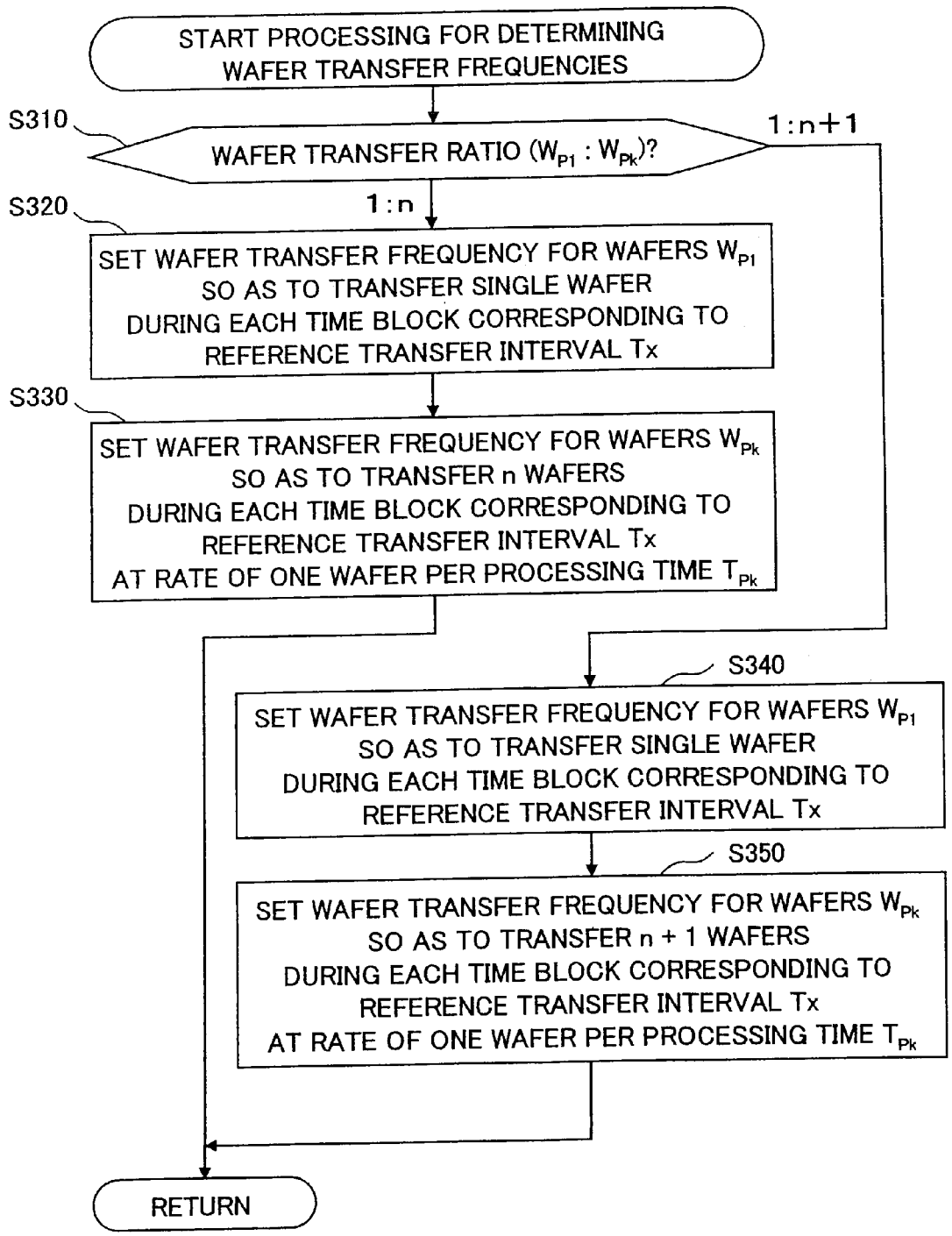
FIG. 4 presents a flowchart of a specific example of the processing executed to determine the wafer transfer frequencies in FIG. 2.

Next, in steps S130 and S140, the processing for determining the wafer transfer timing is executed. Namely, the processing for ascertaining the wafer transfer ratio is executed in step S130, and then in step S140, the processing for determining the wafer transfer frequencies is executed. FIG. 3 presents a specific example of the processing executed in step S130 to determine the wafer transfer ratio, whereas FIG. 4 presents a specific example of the processing executed in step S140 to determine the wafer transfer frequencies. The processing shown in FIGS. 3 and 4 is executed to determine the reference transfer interval Tx relative to the value of 1 assumed for the maximum number m of wafers $W_{P1}$ that can be processed during a single time block corresponding to the reference transfer interval Tx, i.e., relative to the length of processing time $T_{P1}$ at the processing chamber P1 requiring the longest processing time per wafer. FIG. 5 shows processing schedules set for the wafers $W_{P1}$ and $W_{P2}$ transferred from the cassette containers 134 with the wafer transfer timing determined as shown in FIGS. 2 through 4 to be processed at the individual processing chambers P1 and P2. Time is indicated along the horizontal axis in FIG. 5, which shows individual processing schedules for the wafers $W_{P1}$ and $W_{P2}$ processed at the two processing chambers P1 and P2 in bar graphs.

(Specific Example of Processing Executed to Determine the Wafer Transfer Ratio)

In reference to FIG. 3, a specific example of the processing executed to determine the wafer transfer ratio is explained. As shown in FIG. 3, the maximum number n of wafers $W_{Pk}$ that can be processed in the other processing chamber Pk during a single time block (during a single processing time $T_{P1}$ in this example) corresponding to a reference transfer interval Tx matching the length of processing time $T_{P1}$ at the processing chamber P1 requiring the longest processing time per wafer is ascertained in step S210. This value is ascertained so as to minimize the length of wait time at the processing chamber Pk by transferring the wafers $W_{Pk}$ from the cassette containers in the quantity matching the number of wafers that can be processed in the processing chamber Pk during the time block matching the length of processing time $T_{P1}$ at the processing chamber P1.

More specifically, the number n of wafers $W_{Pk}$ is determined by ensuring that the expressions (1-1) and (1-2) below are both true for the value assumed by n. It is to be noted that in expressions (1-1) and (1-2), $T_{P1}$ represents the length of time required to process a single wafer $W_{P1}$ at the processing chamber $_{P1}$, $T_{Pk}$ represents the length of time required to process a single wafer $W_{Pk}$ at the other processing chamber Pk, n is an integer equal to or greater than 1 and k is an integer equal to or greater than 2, as explained earlier. In addition, "·" in expressions (1-1) and (1-2) indicates "multiplied by" (in subsequent expressions, as well).

$$T_{P1} \geq T_{Pk} \cdot n \qquad (1\text{-}1)$$

$$T_{P1} < T_{Pk} \cdot (n+1) \qquad (1\text{-}2)$$

In the subsequent steps S220 through S280, either the processing time $T_{P1}$ at the processing chamber P1 or the processing time $T_{Pk} \cdot (n+1)$, at the processing chamber Pk, which will reduce the lengths of wait time to a greater extent (the value that will reduce the reference transfer interval Tx to a greater extent), is selected as the reference transfer interval Tx and the wafer transfer ratio of the wafers $W_{P1}$ and $W_{Pk}$ to be processed at the individual processing chambers P1 and Pk is determined accordingly. By selecting the length of processing time that will assure shorter lengths of wait time at the processing chambers P1 and Pk as the reference transfer interval Tx, the lengths of wait time to elapse before the processing can be executed at both of the processing chambers P1 and Pk are reduced. As a result, the wait time in the entire substrate processing apparatus is optimized.

More specifically, in step S220, the length of wait time $T_{Wk}$ that will occur in the other processing chamber Pk if the processing time $T_{P1}$ at the processing chamber P1 is selected as the reference transfer interval Tx is calculated as indicated in expression (1-3) below, and then in step S230, the length of wait time $T_{W1}$ to occur at the processing chamber P1 if the processing time $T_{Pk} \cdot (n+1)$ at the processing chamber Pk is selected as the reference transfer interval Tx is calculated as indicated in expression (1-4) below.

$$T_{Wk} = T_{P1} - T_{Pk} \cdot n \qquad (1\text{-}3)$$

$$T_{W1} = T_{Pk} \cdot (n+1) - T_{P1} \qquad (1\text{-}4)$$

Then, in step S240, the lengths of the wait time $T_{W1}$ and $T_{Wk}$ are compared to determine which wait time is shorter. More specifically, a decision as to whether or not the wait time $T_{Wk}$ is equal to or less than the wait time $T_{W1}$ ($T_{Wk} \leq T_{W1}$?)

may be made. If it is decided in step S240 that $T_{Wk} \leq T_{W1}$, i.e., if it is decided that the wait time $T_{Wk}$ is shorter (or the wait times $T_{W1}$ and $T_{Wk}$ are equal to each other), the processing time $T_{P1}$ at the processing chamber P1 is selected as the reference transfer interval Tx for the wafers $W_{P1}$ and $W_{Pk}$ as indicated in expression (1-5) below in step S250, and then, the wafer transfer ratio ($W_{P1}:W_{Pk}$) of the wafers $W_{P1}$ and $W_{Pk}$ is set to 1:n in step S260.

$$Tx = T_{P1} = T_{Pk} \cdot n + T_{Wk} \quad (1\text{-}5)$$

During each time block corresponding to the reference transfer interval Tx ($=T_{P1}=T_{Pk}\cdot n+T_{Wk}$) thus calculated, a single wafer $W_{P1}$ is transferred to be processed at the processing chamber P1, and the wait time at the processing chamber P1 is eliminated altogether, whereas during a time block corresponding to the reference transfer interval Tx, n wafers $W_{Pk}$ are transferred to be processed at the processing chamber Pk and a wait time extending over $T_{Wk}$ occurs at the processing chamber Pk.

If, on the other hand, it is decided in step S240 that $T_{Wk} \leq T_{W1}$ is not true, i.e., if it is decided that the wait time $T_{W1}$ is shorter, the processing time $T_{Pk} \cdot (n+1)$ at the processing chamber Pk is selected as the reference transfer interval Tx for the wafers $W_{P1}$ and $W_{Pk}$ as indicated in expression (1-6) below in step S270, and then, the wafer transfer ratio ($W_{P1}:W_{Pk}$) of the wafers $W_{P1}$ and $W_{Pk}$ is set to 1:n+1 in step S280.

$$Tx = T_{P1} + T_{W1} = T_{Pk} \cdot (n+1) \quad (1\text{-}6)$$

During each time block corresponding to the reference transfer interval Tx ($=T_{P1}+T_{W1}=T_{Pk}\cdot (n+1)$) thus determined, a single wafer $W_{P1}$ is transferred to be processed at the processing chamber P1 with a wait time extending over $T_{W1}$ occurring at the processing chamber P1, whereas during each time block corresponding to the reference transfer interval Tx, n+1 wafers $W_{Pk}$ are transferred to be processed at the processing chamber Pk with the wait time at the processing chamber Pk eliminated altogether. It is to be noted that the reference transfer interval Tx and the wafer transfer ratio determined through the processing shown in FIG. 3 are stored into memory or the like at the control unit 190.

(Specific Example of Processing Executed to Determine Wafer Transfer Frequencies)

Next, a specific example of the processing executed to determine the wafer transfer frequencies is explained in reference to FIG. 4. In this example, the wafer transfer frequencies with which the individual wafers $W_{P1}$ and $W_{Pk}$ are to be actually transferred out of the cassette containers 134 are determined based upon the wafer transfer ratio corresponding to the reference transfer interval Tx determined through the processing shown in FIG. 3 which is executed to set the wafer transfer ratio.

In even more specific terms, the wafer transfer ratio ($W_{P1}:W_{Pk}$) having been determined through the processing in FIG. 3 is extracted from the memory at the control unit 190 and a decision is made as to whether the wafer transfer ratio ($W_{P1}:W_{Pk}$) is 1:n or 1:n+1 in step S310 as shown in FIG. 4.

If it is decided in step S310 that the wafer transfer ratio ($W_{P1}:W_{Pk}$) is 1:n, the wafer transfer frequency for the wafers $W_{P1}$ to be processed at the processing chamber P1 is set in step S320 so that a single wafer $W_{P1}$ is transferred during each time block corresponding to the reference transfer interval Tx. As a result, the wafers $W_{P1}$ are transferred from the cassette containers 134, at the rate of one wafer per time block corresponding to the reference transfer interval Tx, i.e., one wafer per processing time $T_{P1}$. In this case, the reference transfer interval Tx matches the processing time $T_{P1}$ at the processing chamber P1, and accordingly, wafers $W_{P1}$ are continuously processed with no wait time occurring at the processing chamber$_{P1}$, as indicated in the top-side processing schedule in FIG. 5A.

Figure 5A:
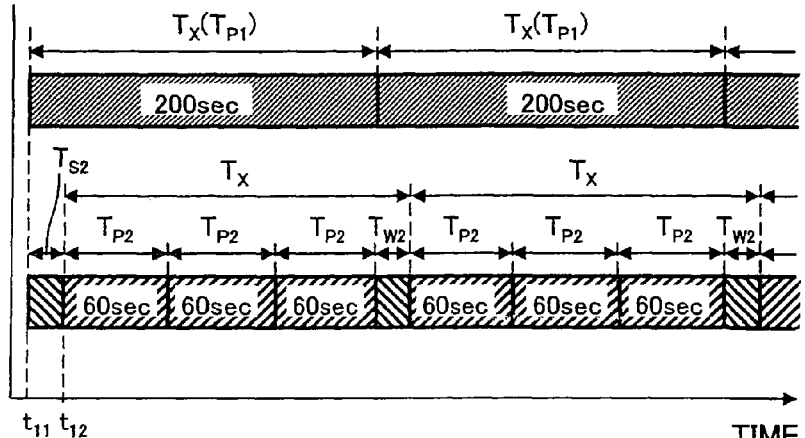
FIGS. 5A, 5B, and 5C show wafer processing schedules for two processing chambers.

Next, in step S330, the wafer transfer frequency for the wafers $W_{Pk}$ to be processed at the processing chamber Pk is set so that n wafers $W_{Pk}$ are transferred during each time block corresponding to the reference transfer interval Tx, with a single wafer $W_{Pk}$ transferred for each processing time $T_{Pk}$. As a result, n wafers $W_{Pk}$ are continuously transferred from the cassette container 134 and then the wait time $T_{Wk}$ during which the operation waits in standby for the next transfer ensues during each time block corresponding to the reference transfer interval Tx. In other words, after n wafers have been transferred continuously from the cassette container 134, the operation waits over the wait time $T_{Wk}$ before the next set of n wafers is continuously transferred from the cassette container 134. In this case, the reference transfer interval Tx matches the sum of the processing time $T_{Pk} \cdot n$ and the wait time $T_{Wk}$ at the processing chamber Pk. Accordingly, n wafers $W_{Pk}$ are continuously processed at the processing chamber Pk and then the wait time $T_{Wk}$ ensues during each time block corresponding to the reference transfer interval Tx, as indicated in the bottom-side processing schedule in FIG. 5A. It is to be noted that FIG. 5A presents a specific example in which k=2 and n=3.

If, on the other hand, it is judged in step S310 that the wafer transfer ratio ($W_{P1}:W_{Pk}$) is 1:n+1, the wafer transfer frequency for the wafers $W_{P1}$ to be processed at the processing chamber P1 is set so that a single wafer is transferred during each time block corresponding to the reference transfer interval Tx in step S340. As a result, a single wafer $W_{P1}$ is transferred from the cassette container 134 and then the transfer wait time $T_{W1}$ ensues during each time block corresponding to the reference transfer interval Tx. Namely, after each wafer is transferred from the cassette container 134, the operation waits over the wait time $T_{W1}$ in standby before another wafer is transferred from the cassette container 134. In this case, the reference transfer interval Tx matches the sum of the processing time $T_{P1}$ and the wait time $T_{W1}$ at the processing chamber P1 and, accordingly, a single wafer $W_{P1}$ is processed and then the wait time $T_{W1}$ ensues at the processing chamber P1 during each time block corresponding to the reference transfer interval Tx, as indicated in the top side processing schedule in FIG. 5B.

Figure 5B:
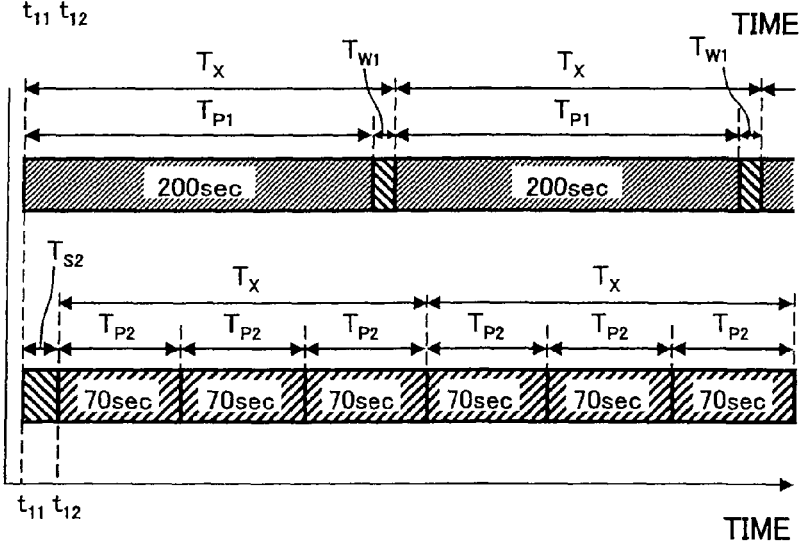

Next, in step S350, the wafer transfer frequency for the wafers $W_{Pk}$ to be processed at the processing chamber Pk is set so that n+1 wafers $W_{Pk}$ are transferred during each time block corresponding to the reference transfer interval Tx, at the rate of a single wafer $W_{Pk}$ transferred per processing time $T_{Pk}$. As a result, n+1 wafers $W_{Pk}$ are continuously transferred from the cassette container 134 during each time block corresponding to the reference transfer interval Tx. In this case, the reference transfer interval Tx matches the processing time $T_{Pk} \cdot (n+1)$ at the processing chamber Pk. Accordingly, n+1 wafers $W_{Pk}$ are continuously processed with no wait time occurring at the processing chamber Pk during each time block corresponding to the reference transfer interval Tx, as indicated in the bottom-side processing schedule in FIG. 5B. It is to be noted that FIG. 5B presents a specific example in which k=2 and n=2.

The wafer transfer ratio and the wafer transfer frequencies determined through the processing shown in FIGS. 3 and 4 are stored by the control unit 190 into its memory or the like. The control unit 190 retrieves the wafer transfer ratio and the wafer transfer frequencies determined through the processing in FIGS. 3 and 4 from the memory or the like for the actual wafer processing, controls the transfer unit-side transfer mechanism 170 based upon the wafer transfer ratio and the wafer transfer frequencies thus retrieved and transfers the wafers $W_{P1}$ and $W_{Pk}$ from the corresponding cassette containers 134.

Thus, the wafers $W_{P1}$ processed at the processing chamber P1 where the wafer processing takes a longer time are transferred from the cassette container 134 over longer time intervals in correspondence to the processing time $T_{P1}$, whereas the wafers $W_{Pk}$ processed at the processing chamber Pk where wafers can be processed quickly are transferred from the wafer containers over shorter time intervals corresponding to the processing time $T_{Pk}$. As a result, wafers $W_{P1}$ intended for the processing chamber P1 with the greater processing time are not kept in standby over an extended time of time at the common transfer chamber 150, the load-lock chamber 160M or 160N, the orienter 137 and the like to delay the transfer of wafers $W_{Pk}$ for the processing chamber $T_{Pk}$ with the shorter processing time from the cassette container 134. Consequently, the operation rates at the individual processing chambers P1 and Pk are improved and the throughput of the substrate processing apparatus is also improved over the prior art.

In addition, the wafers $W_{P1}$ and $W_{Pk}$ are transferred from the cassette containers 134 with the timing (cycle) corresponding to the uniform reference transfer interval Tx and, accordingly, the time blocks each corresponding to the reference transfer interval Tx, during which the wafers $W_{P1}$ and $W_{Pk}$ are transferred, are offset by an extent matching the time lag $T_{Sk}$ between the time point at which the first wafer $W_{P1}$ to be processed is transferred and the time point at which the first wafer $W_{Pk}$ to be processed is transferred. For this reason, the transfer timing for the wafers $W_{P1}$ and the transfer timing for the wafers $W_{Pk}$ never coincide. It is to be noted that the processing shown in FIGS. 3 and 4 can be adopted when the processing time $T_{P1}$ at the processing chamber P1 is exactly an integral multiple of the processing time $T_{Pk}$ at the processing chamber Pk as shown in the processing schedules in FIG. 5C, as well as when the processing time $T_{P1}$ at the processing chamber P1 is not exactly an integral multiple of the processing time $T_{Pk}$ at the processing chamber Pk.

(Processing Executed in Substrate Processing Apparatus with Two Processing Chambers)

Figure 5C:
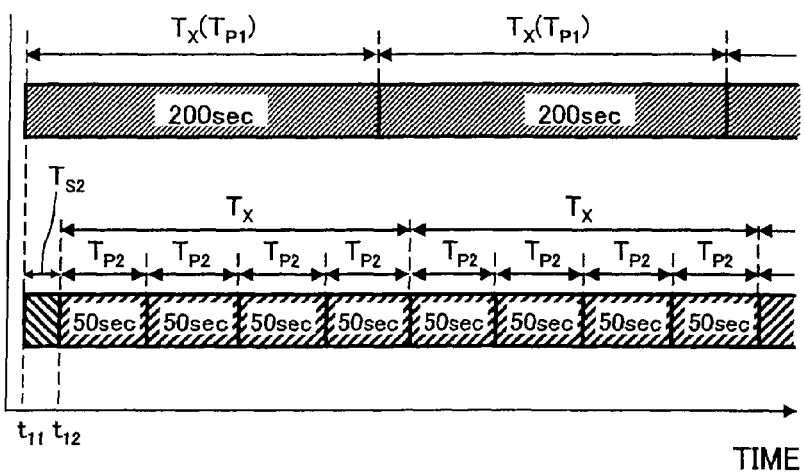

Next, an explanation is given on the processing executed as shown in FIGS. 2 through 4 to determine the transfer timing in a substrate processing apparatus with two processing chambers such as that shown in FIG. 1 by quoting specific numerical values in reference to FIG. 5. FIG. 5A presents an example in which the length of time required in the individual processing chambers 140A and 140B to process a single wafer are 200 sec and 60 sec respectively, FIG. 5B presents an example in which the length of time required in the individual processing chambers 140A and 140B to process a single wafer are 200 sec and 70 sec respectively and FIG. 5C presents an example in which the length of time required in the individual processing chambers 140A and 140B to process a single wafer are 200 sec and 50 sec respectively. In all of the examples, the processing time is longer in the processing chamber 140A and, accordingly, the processing chamber 140A is designated as the processing chamber P1 with the processing time $T_{P1}$ and the other processing chamber 140B is designated as the processing chamber P2 with the processing time $T_{P2}$ in steps S110 and S120 in FIG. 2.

Then, in step S130 in FIG. 2 (such as the processing shown in FIG. 3) and step S140 in FIG. 2 (such as the processing in FIG. 4), the transfer timing is determined based upon the specific lengths of processing time at the two processing chambers. The following is an explanation of the individual examples presented in FIGS. 5A, 5B and 5C.

First, the example presented in FIG. 5A is explained. The example represents a situation in which the wait times at the processing chambers are more effectively reduced by setting the reference transfer interval Tx to the processing time $T_{P1}$ at the processing chamber P1. Since the processing time $T_{P1}$ at the processing chamber P1 is 200 sec and the processing time $T_{P2}$ at the processing chamber P2 is 60 sec in the example in FIG. 5A, 200 sec and 60 sec are used for substitution in expressions (1-1) and (1-2) with k set to 2 in step S210 in FIG. 3 to determine the value of n that satisfies the relationships expressed in the expressions (n=3).

Next, in steps S220 and S230, the individual numerical values are used for substitution in expressions (1-3) and (1-4) with k at 2 to calculate the wait time $T_{W2}$ at the processing chamber P2 as $T_{W2}=200-60\times3=20$ sec and the wait time $T_{W1}$ at the processing chamber P1 as $T_{W1}=60\times4-200=40$ sec. Since the wait time $T_{W2}$ (=20 sec) at the processing chamber P2 is shorter than the wait time $T_{W1}$ (=40 sec) at the processing chamber P1, the processing time $T_{P1}$ (=200 sec) at the processing chamber P1 is selected as the reference transfer interval Tx for the wafers $W_{P1}$ and $W_{P2}$ and, accordingly, the wafer transfer ratio of the wafers $W_{P1}$ to be processed at the processing chamber P1 and the wafers $W_{P2}$ to be processed at the processing chamber P2 ($W_{P1}:W_{P2}$) is set to 1:3, through the processing executed in steps S240, S250 and S260.

Next, in steps S310, S320 and S330 in FIG. 4, the wafer transfer frequency for the wafers $W_{P1}$ to be processed at the processing chamber P1 is set so that a single wafer $W_{P1}$ is transferred during each time block corresponding to the reference transfer interval Tx (=200 sec) and the wafer transfer frequency for the wafers $W_{P2}$ to be processed at the processing chamber P2 is set so that three wafers $W_{P2}$ are transferred during each time block corresponding to the reference transfer interval Tx (=200 sec) at the rate of one wafer $W_{P2}$ per processing time $T_{P2}$ (=60 sec).

As the individual wafers $W_{P1}$ and $W_{P2}$ are transferred from the cassette containers 134 with the wafer transfer timing described above, they are processed at the processing chambers P1 and P2 as indicated in the processing schedules in FIG. 5A. In this case, the wafers $W_{P1}$ are processed continuously with no wait time occurring at the processing chamber P1. At the processing chamber P2, a set of three wafers $W_{P2}$ is continuously processed and then the wait time $T_{W2}$ (=20 sec) ensues during each time block corresponding to the reference transfer interval Tx (=200 sec).

The example presented in FIG. 5B is explained next. The example represents a situation in which the wait times at the processing chambers are more effectively reduced by setting the reference transfer interval Tx to the processing time $T_{P2}$·(n+1) at the processing chamber P2. Since the processing time $T_{P1}$ at the processing chamber P1 is 200 sec and the processing time $T_{P2}$ at the processing chamber P2 is 70 sec in the example in FIG. 5B, 200 sec and 70 sec are used for substitution in expressions (1-1) and (1-2) with k set to 2 in step S210 in FIG. 3 to determine the value of n that satisfies the relationships expressed in the expressions (n=2).

Next, in steps S220 and S230, the individual numerical values are used for substitution in expressions (1-3) and (1-4) with k at 2 to calculate the wait time $T_{W2}$ at the processing chamber P2 as $T_{W2}=200-70\times2=60$ sec and the wait time $T_{W1}$ at the processing chamber P1 as $T_{W1}=70\times3-200=10$ sec. Since the wait time $T_{W1}$ (=10 sec) at the processing chamber P1 is shorter than the wait time $T_{W2}$ (=60 sec) at the processing chamber P2, the processing time $70\times3$ (=210 sec) at the processing chamber P2 is selected as the reference transfer interval Tx for the wafers $W_{P1}$ and $W_{P2}$ and, accordingly, the wafer transfer ratio of the wafers $W_{P1}$ and the wafers $W_{P2}$ ($W_{P1}$:$W_{P2}$) is set to 1:3, through the processing executed in steps S240, S270 and S280.

Next, in steps S310, S340 and S350 in FIG. 4, the wafer transfer frequency for the wafers $W_{P1}$ to be processed at the processing chamber P1 is set so that a single wafer $W_{P1}$ is transferred during each time block corresponding to the reference transfer interval Tx (=210 sec) and the wafer transfer frequency for the wafers $W_{P2}$ to be processed at the processing chamber P2 is set so that three wafers $W_{P2}$ are transferred during each time block corresponding to the reference transfer interval Tx (=210 sec) at the rate of one wafer $W_{P2}$ per processing time $T_{P2}$ (=70 sec).

As the individual wafers $W_{P1}$ and $W_{P2}$ are transferred from the cassette containers 134 with the wafer transfer timing determined as described above, the processing at the processing chambers P1 and P2 is executed as indicated in the processing schedules in FIG. 5B. In this case, a wafer $W_{P1}$ is continuously processed and then the wait time $T_{P1}$ (=10 sec) ensues during each time block corresponding to the reference transfer interval Tx (=210 sec) at the processing chamber P1, whereas three wafers $W_{P2}$ are processed continuously with no wait time during each time block corresponding to the reference transfer interval Tx (=210 sec) at the processing chamber P2.

Next, the example presented in FIG. 5C is explained. In this example, the processing time $T_{P1}$ at the processing chamber P1 is equal to the processing time $T_{P2} \cdot n$ at the processing chamber P2. Under these circumstances, by selecting the processing time $T_{P2} \cdot n$ at the processing chamber P2 (or the processing time $T_{P1}$ at the processing chamber P1) as the reference transfer interval Tx, the wait times at the two processing chambers can both be eliminated. In the example presented in FIG. 5C, the processing time $T_{P1}$ at the processing chamber P1 is 200 sec and the processing time $T_{P2}$ at the processing chamber P2 is 50 sec. By using these values for substitution in expressions (1-1) and (1-2) with k set at 2 in step S210 in FIG. 3, the value of n satisfying the relationships in these expressions is determined to be 4.

Next, in steps S220 and S230, the individual numerical values are used for substitution in expressions (1-3) and (1-4) with k at 2 to calculate the wait time $T_{W2}$ at the processing chamber P2 as $T_{W2}$=200−50×4=0 sec and the wait time $T_{W1}$ at the processing chamber P1 as $T_{W1}$=50×5−200=50 sec. Since the wait time $T_{W2}$ (=0 sec) at the processing chamber P2 is shorter than the wait time $T_{W1}$ (=50 sec) at the processing chamber P1, the processing time $T_{P2} \cdot n$ (=200 sec) at the processing chamber P2 is selected as the reference transfer interval Tx for the wafers $W_{P1}$ and $W_{P2}$ and, accordingly, the wafer transfer ratio of the wafers $W_{P1}$ and the wafers $W_{P2}$ ($W_{P1}$:$W_{P2}$) is set to 1:4, through the processing executed in steps S240, S270 and S280.

Next, in steps S310, S340 and S350 in FIG. 4, the wafer transfer frequency for the wafers $W_{P1}$ to be processed at the processing chamber P1 is set so that a single wafer $W_{P1}$ is transferred during each time block corresponding to the reference transfer interval Tx (=200 sec) and the wafer transfer frequency for the wafers $W_{P2}$ to be processed at the processing chamber P2 is set so that four wafers $W_{P2}$ are transferred during each time block corresponding to the reference transfer interval Tx (=200 sec) at the rate of one wafer $W_{P2}$ per processing time $T_{P2}$ (=50 sec).

As the individual wafers $W_{P1}$ and $W_{P2}$ are transferred from the cassette containers 134 with the wafer transfer timing determined as described above, the processing at the processing chambers P1 and P2 are executed as indicated in the processing schedules in FIG. 5C. In this case, wafers $W_{P1}$ are continuously processed with no wait time occurring before the processing of the next wafer starts, at the rate of one wafer processed during each time block corresponding to the reference transfer interval Tx (=200 sec) at the processing chamber P1, whereas four wafers $W_{P2}$ are processed continuously with no wait time during each time block corresponding to the reference transfer interval Tx (=200 sec) at the processing chamber P2.

(Processing Executed in Substrate Processing Apparatus with Three or More Processing Chambers)

Figure 6:
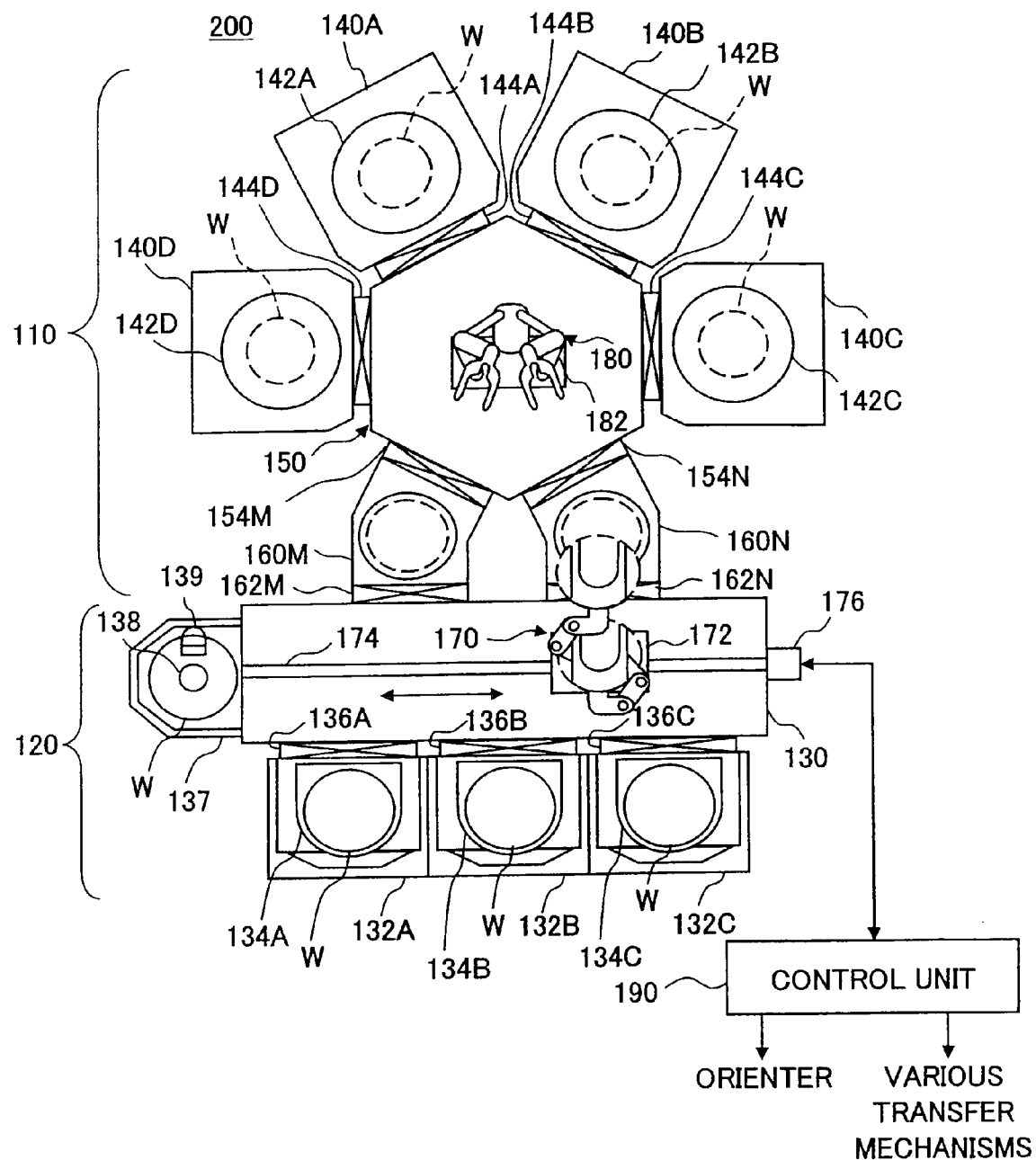
FIG. 6 presents a structural example adopted in the substrate processing apparatus achieved in another embodiment of the present invention.

Next, an explanation is given on the processing executed to determine the transfer timing as shown in FIGS. 2 through 4 for a substrate processing apparatus with three or more processing chambers. FIG. 6 schematically shows the structure of a substrate processing apparatus that includes three or four processing chambers. The processing chamber 200 in FIG. 6 adopts a structure substantially similar to that of the substrate processing apparatus 100 in FIG. 1, with chambers 140C and 140D also connected via gate valves 144C and 144D on the two sides of the common transfer chamber 150. In a substrate processing apparatus 200 with three processing chambers, the chamber 140C may be formed as a chamber where wafers are processed and the chamber 140D may be formed as an inspection chamber where various types of inspections including the measurement of processing results conducted on processed wafers are executed. Alternatively, the substrate processing apparatus 200 may be four-processing chamber apparatus, in which both chambers 140C and 140D are used as processing chambers. It is to be noted that a cassette stage 132C is disposed on one side of the transfer chamber 130 along the longer side of its polygonal section to accommodate another cassette container 134C in the substrate processing apparatus 200 in FIG. 6. The cassette container 134C may contain wafers to be processed at the chambers 140C and/or 140D formed as processing chambers.

Figure 7:
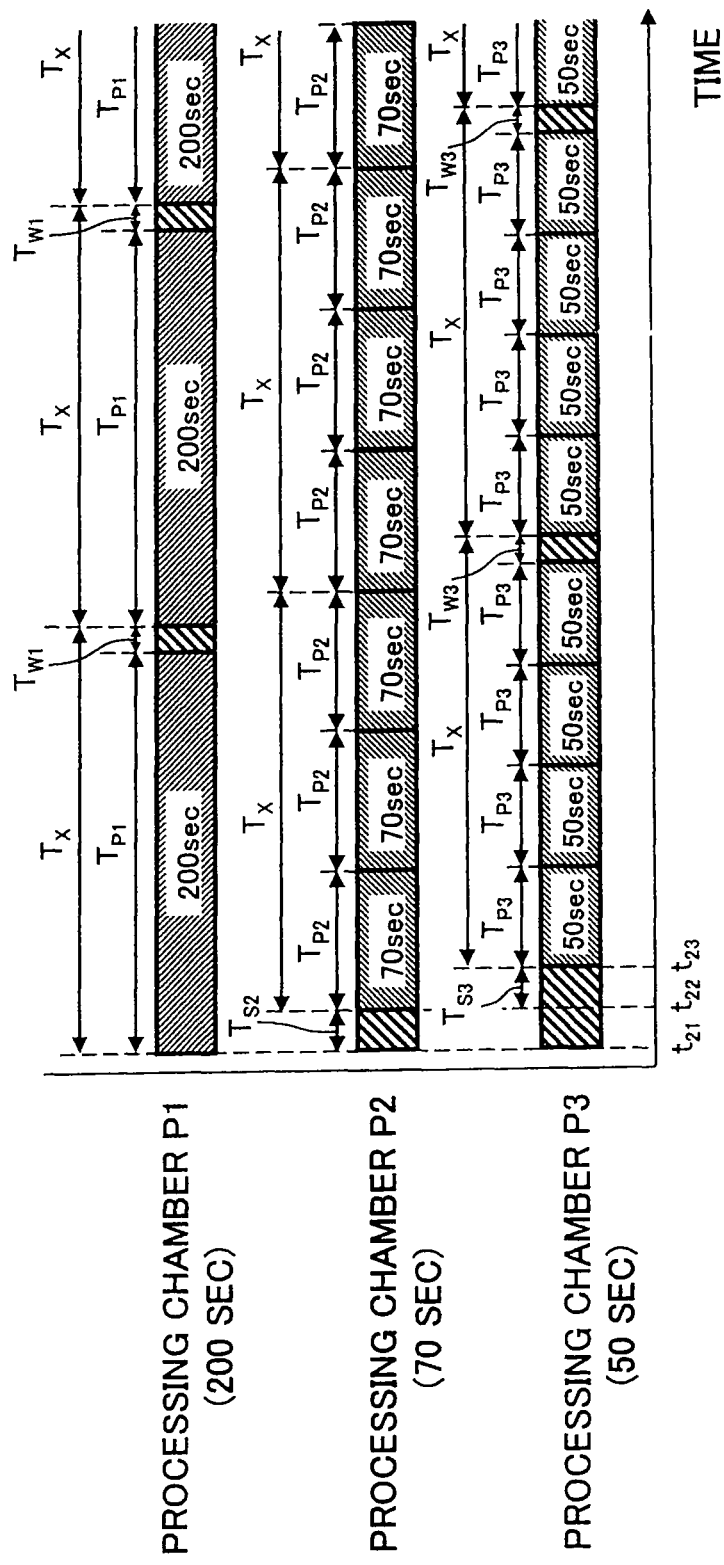
FIG. 7 shows wafer processing schedules that may be set in conjunction with three processing chambers.

First, the processing executed to determine the transfer timing as shown in FIGS. 2 through 4 for the substrate processing apparatus 200 in FIG. 6 with three processing chambers is explained by quoting specific numerical values in reference to FIG. 7. FIG. 7 shows the processing schedules for wafers to be processed in the individual processing chambers with the transfer timing determined as shown in FIGS. 2 through 4. In FIG. 7, time is indicated along the horizontal axis and the processing schedules for the wafers to be processed in the three processing chambers P1, P2 and P3 are each indicated in a bar graph. In the example presented in FIG. 7, it takes 200 sec, 70 sec, and 50 sec to process a single wafer in the processing chambers 140A, 140B and 140C respectively.

In this example, the processing chamber with the longest processing time is the processing chamber 140A and accordingly, the processing chamber 140A is designated as the processing chamber P1 with the processing time $T_{P1}$, the processing chamber 140B is designated as the processing chamber P2 with the processing time $T_{P2}$ and the processing chamber 140C is designated as the processing chamber P3 with the processing time $T_{P3}$, through the processing executed in steps S110 and S120 in FIG. 2. Under these circumstances, the transfer timing for the wafers $W_{P1}$ and $W_{P2}$ is determined based upon the relationship between the processing chambers P1 and P2, and the transfer timing for the wafers $W_{P3}$ is determined based upon the relationship between the processing chambers P1 and P3. However, the uniform reference transfer interval Tx selected when determining the transfer timing for the wafers $W_{P1}$ and $W_{P2}$ is also used when determining the transfer timing for the wafers $W_{P3}$. The specific method adopted to determine such wafer transfer timing is now explained in detail.

First, based upon the relationship between the processing chamber P1 and the processing chamber P2, the transfer timing for the wafers $W_{P1}$ and $W_{P2}$ is determined. The relationship between the processing chambers P1 and P2 is similar to that in the example presented in FIG. 5B and accordingly, the processing time 70 sec×3 (=210 sec) at the processing chamber P2 is selected as the reference transfer interval Tx for the wafers $W_{P1}$ and $W_{P2}$, which sets the wafer transfer ratio ($W_{P1}$:$W_{P2}$) for the wafers $W_{P1}$ and $W_{P2}$ to 1:3. The wafer transfer frequency for the wafers $W_{P1}$ is set so that a single wafer is transferred in each time block corresponding to the reference transfer interval Tx (=210 sec) and the wafer transfer frequency for the wafers $W_{P2}$ is set so that three wafers $W_{P2}$ are transferred in each time block corresponding to the reference transfer interval Tx (=210 sec) at the rate of one wafer per processing time $T_{P2}$ (=70 sec).

Next, the transfer timing for the wafers $W_{P3}$ to be processed at the processing chamber P3 is determined based upon the relationship between the processing chambers P1 and P3. Since the reference transfer interval Tx of 210 sec has already been selected, the transfer timing for the wafers $W_{P3}$ is calculated based upon this reference transfer interval. More specifically, the processing in steps S210, S220 and S260 is executed with the reference transfer interval Tx fixed at 210 sec and then the processing in steps S310 and S330 in FIG. 4 is executed accordingly.

Namely, in step S210, specific numerical values are used for substitution in expressions (1-1) and (1-2) with k set to 3 to determine the value of n that satisfies the relationships indicated in the expressions (n=4). Then, in step S220, the numerical values are used for substitution in expression (1-3) with k set to 3 to calculate the wait time $T_{W3}$ at the processing chamber P3 as $T_{W3}$=210−50×4=10 sec. In step S260, the wafer transfer ratio ($W_{P1}$:$W_{P3}$) of the wafers $W_{P1}$ to be processed at the processing chamber P1 and the wafers $W_{P3}$ to be processed at the processing chamber P3 is set to 1:4. Subsequently, through the processing executed in steps S310 and S330 in FIG. 4, the wafer transfer frequency for the wafers $W_{P3}$ to be processed at the processing chamber P3 is set so that four wafers $W_{P3}$ are transferred during each time block corresponding to the reference transfer interval Tx (=210 sec) at the rate of one wafer per processing time $T_{P3}$ (=50 sec).

As the individual wafers $W_{P1}$, $W_{P2}$ and $W_{P3}$ are transferred from the cassette containers 134 with the wafer transfer timing determined as described above, the wafers are processed at the processing chambers P1, P2 and P3 as indicated in the processing schedules presented in FIG. 7. In this case, a wafer $W_{P1}$ is continuously processed and then the wait time $T_{W1}$ (=10 sec) ensues at the processing chamber P1 during each time block corresponding to the reference transfer interval Tx (=210 sec), three wafers $W_{P2}$ are continuously processed with no wait time at the processing chamber P2 during each time block corresponding to the reference transfer interval Tx, and four wafers $W_{P3}$ are continuously processed and then the wait time $T_{W3}$ (=10 sec) ensues at the processing chamber P3 during each time block corresponding to the reference transfer interval Tx.

Figure 8:
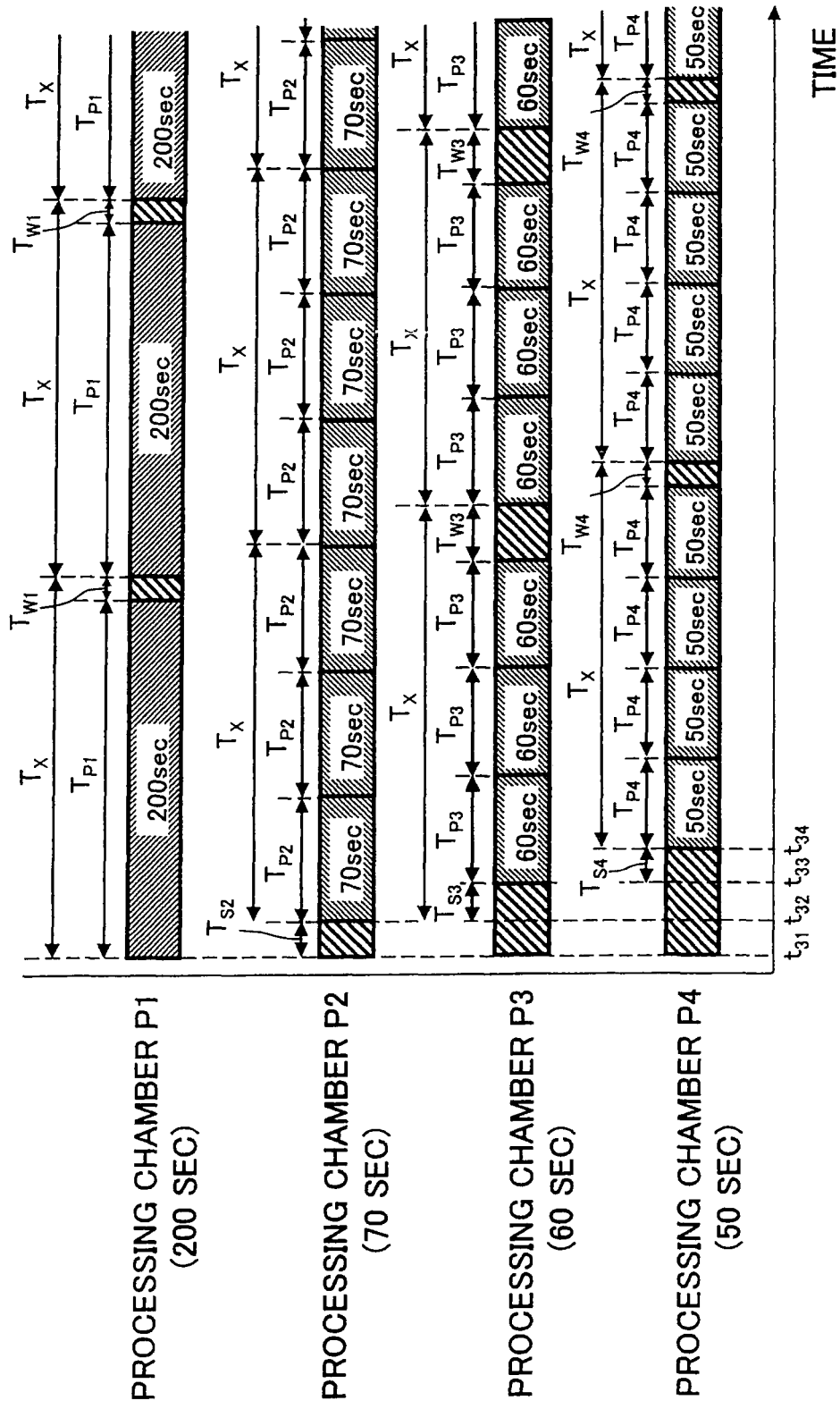
FIG. 8 shows wafer processing schedules that may be set in conjunction with four processing chambers.

The processing executed to determine the transfer timing as shown in FIGS. 2 through 4 for the substrate processing apparatus 200 in FIG. 6 with four processing chambers is explained next by quoting specific numerical values in reference to FIG. 8. FIG. 8 shows the processing schedules for wafers to be processed in the individual processing chambers with the transfer timing determined as shown in FIGS. 2 through 4. In FIG. 8, time is indicated along the horizontal axis and the processing schedules for the wafers to be processed in the four processing chambers P1, P2, P3 and P4 are each indicated in a bar graph. In the example presented in FIG. 8, it takes 200 sec, 70 sec, 60 sec and 50 sec to process a single wafer in the processing chambers 140A, 140B, 140C and 140D respectively.

In this example, the processing chamber with the longest processing time is the processing chamber 140A and accordingly, the processing chamber 140A is designated as the processing chamber P1 with the processing time $T_{P1}$, the processing chamber 140B is designated as the processing chamber P2 with the processing time $T_{P2}$, the processing chamber 140C is designated as the processing chamber P3 with the processing time $T_{P3}$ and the processing chamber 140D is designated as the processing chamber P4 with the processing time $T_{P4}$ through the processing executed in steps S110 and S120 in FIG. 2. Under these circumstances, the transfer timing for the wafers $W_{P1}$ and $W_{P2}$ is determined based upon the relationship between the processing chambers P1 and P2, the transfer timing for the wafers $W_{P3}$ is determined based upon the relationship between the processing chambers P1 and P3, and the transfer timing for the wafers $W_{P4}$ is determined based upon the relationship between the processing chambers P1 and P4. However, the uniform reference transfer interval Tx selected when determining the transfer timing for the wafers $W_{P1}$ and $W_{P2}$ is also used when determining the transfer timing for the wafers $W_{P3}$ and the transfer timing for the wafers $W_{P4}$. The specific method adopted to determine such wafer transfer timing is now explained in detail.

First, based upon the relationship between the processing chamber P1 and the processing chamber P2, the transfer timing for the wafers $W_{P1}$ and $W_{P2}$ is determined. The relationship between the processing chambers P1 and P2 is similar to that in the example presented in FIG. 5B and accordingly, the processing time 70 sec×3 (=210 sec) at the processing chamber P2 is selected as the reference transfer interval Tx for the wafers $W_{P1}$ and $W_{P2}$, which sets the wafer transfer ratio ($W_{P1}$:$W_{P2}$) for the wafers $W_{P1}$ and $W_{P2}$ to 1:3. The wafer transfer frequency for the wafers $W_{P1}$ is set so that a single wafer is transferred in each time block corresponding to the reference transfer interval Tx (=210 sec) and the wafer transfer frequency for the wafers $W_{P2}$ is set so that three wafers $W_{P2}$ are transferred in each time block corresponding to the reference transfer interval Tx (=210 sec) at the rate of one wafer per processing time $T_{P2}$ (=70 sec).

Next, the transfer timing for the wafers $W_{P3}$ to be processed at the processing chamber P3 is determined based upon the relationship between the processing chambers P1 and P3. Since the reference transfer interval Tx of 210 sec has already been selected, the transfer timing for the wafers $W_{P3}$ is calculated based upon this reference transfer interval. More specifically, the processing in steps S210, S220 and S260 is executed with the reference transfer interval Tx fixed at 210 sec and then the processing in steps S310 and S330 in FIG. 4 is executed accordingly.

Namely, in step S210, the specific numerical values are used for substitution in expressions (1-1) and (1-2) with k set to 3 to determine the value of n that satisfies the relationships indicated in the expressions (n=3). Then, in step S220, the numerical values are used for substitution in expression (1-3) with k set to 3 to calculate the wait time $T_{W3}$ at the processing chamber P3 as $T_{W3}$=210−60×3=30 sec. In step S260, the wafer transfer ratio ($W_{P1}$:$W_{P3}$) of the wafers $W_{P1}$ to be processed at the processing chamber P1 and the wafers $W_{P3}$ to be processed at the processing chamber P3 is set to 1:3. Subsequently, through the processing executed in steps S310 and S330 in FIG. 4, the wafer transfer frequency for the wafers $W_{P3}$ to be processed at the processing chamber P3 is set so that three wafers $W_{P3}$ are transferred during each time block corresponding to the reference transfer interval Tx (=210 sec) at the rate of one wafer per processing time $T_{P3}$ (=60 sec).

Next, the transfer timing for the wafers $W_{P4}$ to be processed at the processing chamber P4 is determined based upon the relationship between the processing chambers P1 and P4. Since the reference transfer interval Tx is already set to 210 sec, the transfer timing for the wafers $W_{P4}$ is calculated based upon this reference transfer interval. More specifically, the processing in steps S210, S220 and S260 is executed with the reference transfer interval Tx fixed at 210 sec and then the processing in steps S310 and S330 in FIG. 4 is executed.

Namely, in step S210, specific numerical values are used for substitution in expressions (1-1) and (1-2) with k set to 4 to determine the value of n that satisfies the relationships indicated in the expression (n=4). Then, in step S220, the numerical values are used for substitution in expression (1-3) with k set to 4 to calculate the wait time Tw4 at the processing chamber P4 as Tw4=210−50×4=10 sec. In step S260, the wafer transfer ratio ($W_{P1}$:$W_{P4}$) of the wafers $W_{P1}$ to be processed at the processing chamber P1 and the wafers $W_{P4}$ to be processed at the processing chamber P4 is set to 1:4. Subsequently, through the processing executed in steps S310 and S330 in FIG. 4, the wafer transfer frequency for the wafers $W_{P4}$ to be processed at the processing chamber P4 is set so that four wafers $W_{P4}$ are transferred during each time block corresponding to the reference transfer interval Tx (=210 sec) at the rate of one wafer per processing time $T_{P4}$ (=50 sec).

As the individual wafers $W_{P1}$, $W_{P2}$, $W_{P3}$ and $W_{P4}$ are transferred from the cassette containers 134 with the wafer transfer timing determined as described above, the wafers are processed at the processing chambers P1, P2, P3 and P4 as indicated in the processing schedules presented in FIG. 8. In this case, a wafer $W_{P1}$ is continuously processed and then the wait time $T_{W1}$ (=10 sec) ensues at the processing chamber P1 during each time block corresponding to the reference transfer interval Tx (=210 sec), three wafers $W_{P2}$ are continuously processed with no wait time at the processing chamber P2 during each time block corresponding to the reference transfer interval Tx, three wafers $W_{P3}$ are continuously processed and then the wait time $T_{W3}$ (=30 sec) ensues at the processing chamber P3 during each time block and four wafers $W_N$ are continuously processed and the wait time Tw4 (=10 sec) ensues during each time block at the processing chamber P4.

(Other Examples of Processing Executed to Determine Wafer Transfer Timing)

Figure 9:
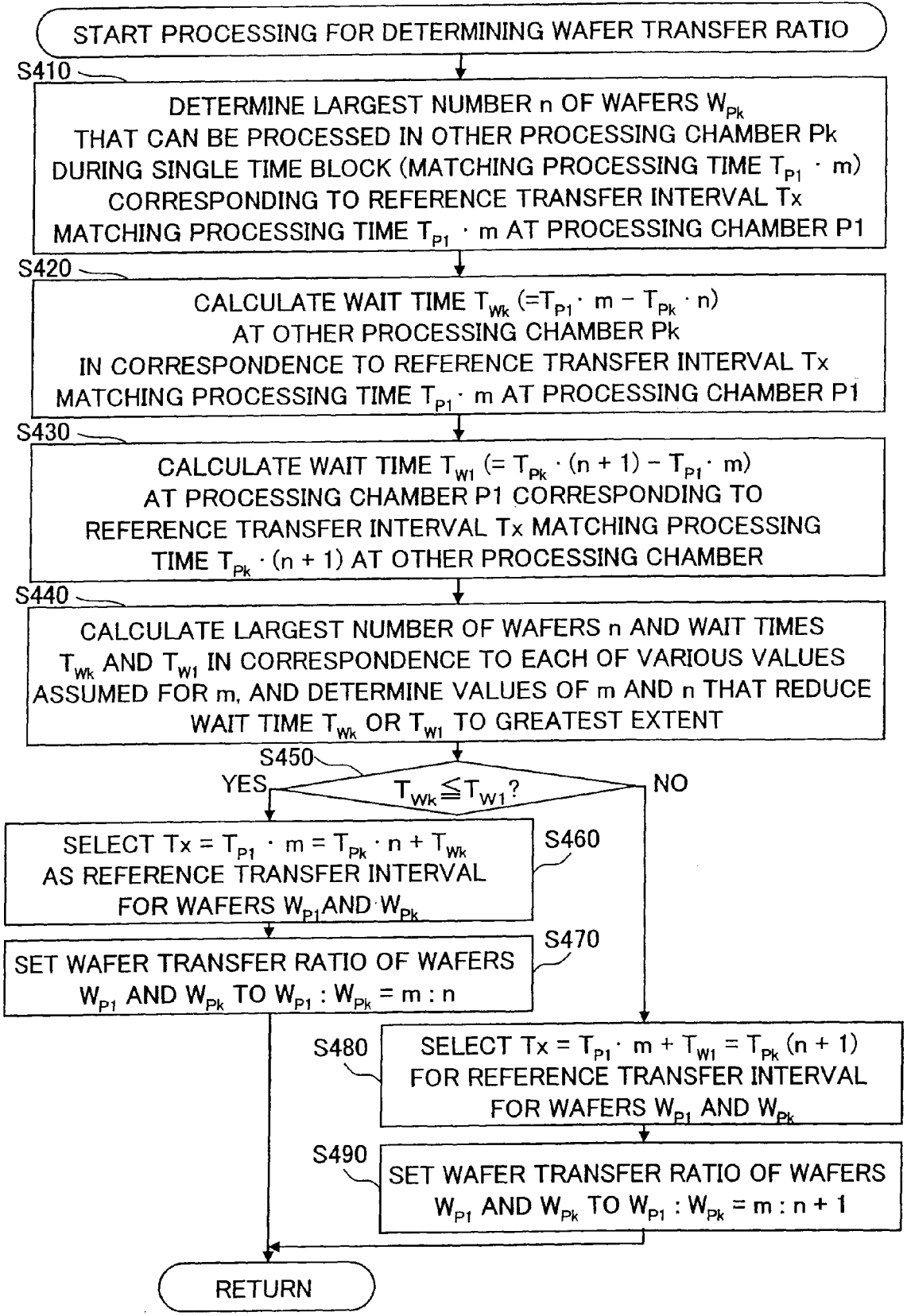
FIG. 9 presents a flowchart of another specific example of the processing executed to determine the wafer transfer ratio in FIG. 2.
Figure 10:
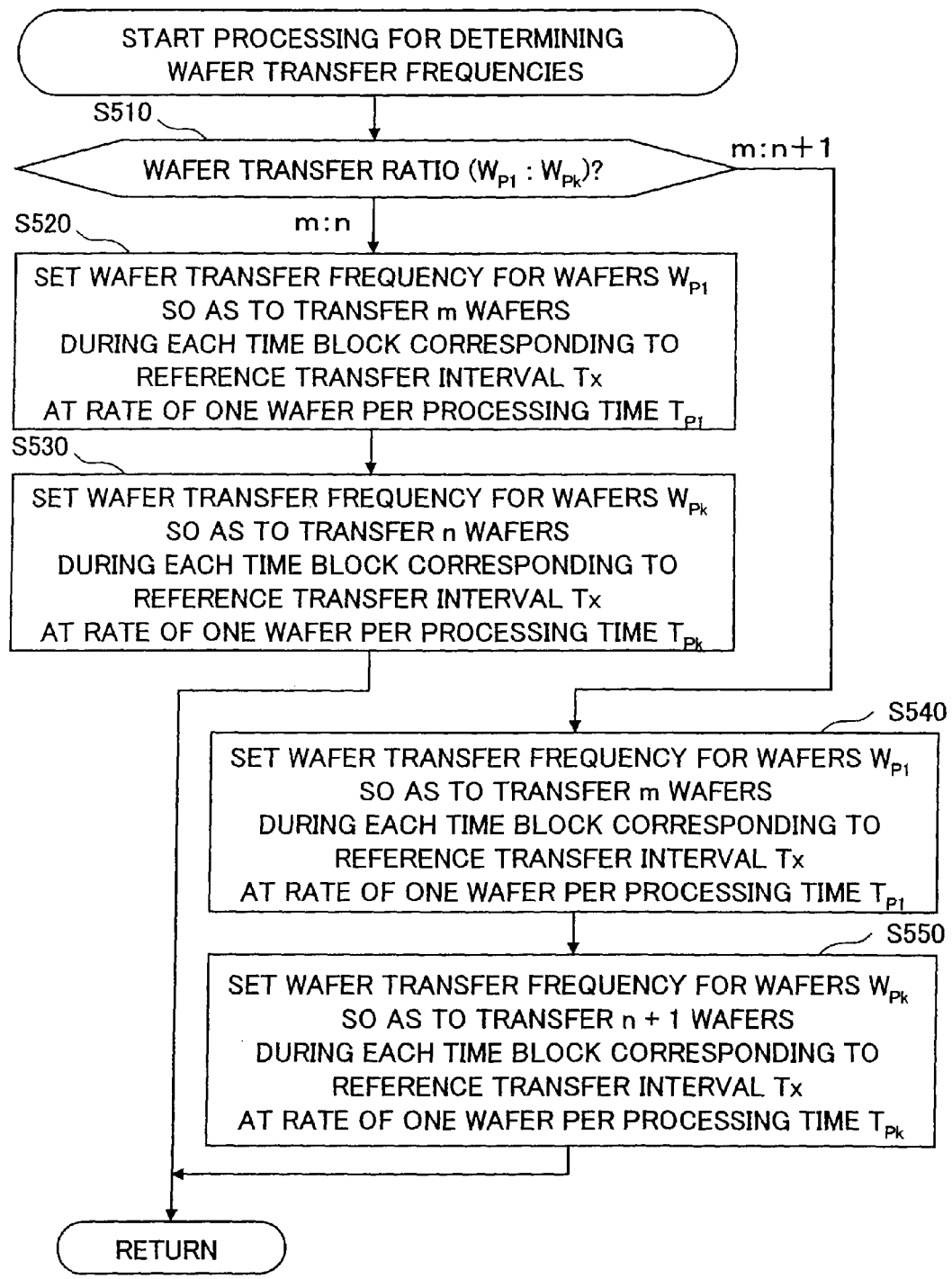
FIG. 10 presents a flowchart of another specific example of the processing executed to determine the wafer transfer frequencies in FIG. 2.

Next, other specific examples of processing executed to determine wafer transfer timing based upon the principal of the present invention explained earlier are described in reference to drawings. Since the alternative processing in these examples is executed as part of a main routine similar to that shown in FIG. 2, a detailed explanation of the main routine is not provided. FIG. 9 presents a specific example of alternative processing that may be executed to determine the wafer transfer ratio in step S130 in FIG. 2 and FIG. 10 presents a specific example of alternative processing that may be executed to determine the wafer transfer frequencies in step S140 in FIG. 2. Through the processing shown in FIGS. 9 and 10, a wafer transfer ratio and wafer transfer frequencies are determined in reference to the length of processing time $T_{P1}\cdot m$ at the processing chamber P1 where the length of time required to process a single wafer is the longest, with m representing the number of wafers $W_{P1}$ that can be processed during each time block corresponding to a reference transfer interval Tx. It is to be noted that while m may assume a value of 1, the wafer transfer timing determined when m=1 is identical to the wafer transfer timing determined through the processing shown in FIGS. 3 and 4.

(Specific Example of Alternative Processing Executed to Determine Wafer Transfer Ratio)

The specific example of the alternative processing executed to determine the wafer transfer ratio is now explained in reference to FIG. 9. As shown in FIG. 9, the maximum number n of wafers $W_{Pk}$ that can be processed in another processing chamber Pk during a time block (matching the processing time $T_{P1}\cdot m$ in this example) corresponding to a reference transfer interval Tx matching the processing time $T_{P1}\cdot m$ at the processing chamber P1 where the length of time required to process a single wafer is the greatest is determined in step S410. By transferring the maximum number of wafers $W_{Pk}$ that can be processed in the other processing chamber Pk within the duration of the processing time $T_{P1}\cdot m$ at the processing chamber P1, the length of wait time to occur at the processing chamber Pk can be minimized.

More specifically, the number n of wafers $W_{Pk}$ is determined by ensuring that n satisfies the relationships expressed in both (2-1) and (2-2). It is to be noted that in expressions (2-1) and (2-2) below, $T_{P1}$ represents the length of time required to process a single wafer $W_{P1}$ at the processing chamber P1, $T_{Pk}$ represents the length of time required to process a single wafer $W_{Pk}$ in the other processing chamber Pk, n indicates an integer equal to or greater than 1, m indicates an integer equal to or greater than 1 and k indicates an integer equal to or greater than 2.

$$T_{P1}\cdot m \geq T_{Pk}\cdot n \qquad (2\text{-}1)$$

$$T_{P1}\cdot m < T_{Pk}\cdot (n+1) \qquad (2\text{-}2)$$

In the subsequent steps S420 through S490, values for m and n are determined so as to minimize the lengths of wait time at the individual processing chambers, either the processing time $T_{P1}$ at the processing chamber P1 or the processing time $T_{Pk}\cdot(n+1)$ at the processing chamber Pk that reduces the wait times by a greater extent (that sets the reference transfer interval Tx to a smaller value) is selected for the reference transfer interval Tx, and the wafer transfer ratio of the wafers $W_{P1}$ and $W_{Pk}$ to be processed at the individual processing chambers P1 and Pk is determined. As a result, the lengths of processing-wait times can be reduced for all the processing chambers P1 and Pk. This, in turn, ultimately optimizes the operation by minimizing wait times in the overall substrate processing apparatus.

More specifically, in step S420, the wait time $T_{Wk}$ to occur at the other processing chamber Pk in correspondence to a reference transfer interval Tx matching the processing time $T_{P1}\cdot m$ at the processing chamber P1 is determined as indicated in expression (2-3) below, and then in step S430, the wait time $T_{W1}$ to occur at the processing chamber P1 in correspondence to a reference transfer interval Tx matching the processing time $T_{Pk}\cdot(n+1)$ at the processing chamber Pk is determined as indicated in expression (2-4) below.

$$T_{Wk}=T_{P1}\cdot m - T_{Pk}\cdot n \qquad (2\text{-}3)$$

$$T_{W1}=T_{Pk}\cdot(n+1)-T_{P1}\cdot m \qquad (2\text{-}4)$$

Subsequently, the maximum number of wafers n and the wait times $T_{Wk}$ and $T_{W1}$ are determined through the processing in steps S410, S420 and S430 in correspondence to each of various values assumed for m (e.g., by increasing the value of m by 1) and specific values of m and n at which either the wait time $T_{Wk}$ or the wait time $T_{W1}$ assumes the smallest value are ascertained in step S440.

Next, in step S450, the individual wait times $T_{W1}$ and $T_{Wk}$ corresponding to the values of m and n determined in step S440, as described above, are compared with each other to determine the shorter wait time. More specifically, a decision is made as to whether or not the wait time $T_{Wk}$ is equal to or less than the wait time $T_{W1}$ ($T_{Wk} \leq T_{W1}$). If it is decided in step S450 that $T_{Wk} \leq T_{W1}$, i.e., if the wait time $T_{Wk}$ is shorter (or the wait time $T_{W1}$ and $T_{Wk}$ are equal to each other), the processing time $T_{P1} \cdot m$ at the processing chamber P1 is selected as the reference transfer interval Tx for the wafers $W_{P1}$ and $W_{Pk}$ in step S460 as indicated in expression (2-5) below, and the wafer transfer ratio ($W_{P1}:W_{Pk}$) of the wafers $W_{P1}$ and $W_{Pk}$ is set to m:n in step S470.

$$Tx = T_{P1} \cdot m = T_{Pk} \cdot n + T_{Wk} \quad (2\text{-}5)$$

m wafers $W_{P1}$ are transferred to be processed at the processing chamber P1 during each time block corresponding to the reference transfer interval Tx ($=T_{P1} \cdot m = T_{Pk} \cdot n + T_{Wk}$) thus determined and the wait time at the processing chamber P1 is eliminated altogether, whereas n wafers $W_{Pk}$ are transferred to be processed at the processing chamber Pk and once the n wafers $W_{Pk}$ are processed, the wait time $T_{Wk}$ ensues at the processing chamber Pk during each time block corresponding to the reference transfer interval Tx.

If, on the other hand, it is decided in step S450 that $T_{Wk} \leq T_{P1}$ is not true, i.e., if it is decided that the wait time $T_{W1}$ is shorter, the processing time $T_{Pk} \cdot (n+1)$ at the processing chamber Pk is selected as the reference transfer interval Tx for the wafers $W_{P1}$ and $W_{Pk}$ as indicated in expression (2-6) in step S480, and then the wafer transfer ratio ($W_{P1}:W_{Pk}$) of the wafers $W_{P1}$ and $W_{P2}$ is set to m:n+1 in step S490.

$$Tx = T_{P1} \cdot m + T_{W1} = T_{Pk} \cdot (n+1) \quad (2\text{-}6)$$

In this case, m wafers $W_{P1}$ are transferred to be processed at the processing chamber P1 and once the m wafers $W_{P1}$ are processed, the wait time $T_{W1}$ ensues at the processing chamber P1 during each time block corresponding to the reference transfer interval Tx ($=T_{P1} \cdot m + T_{W1} = T_{Pk} \cdot (n+1)$) thus determined, whereas n+1 wafers $W_{Pk}$ are transferred to be processed at the processing chamber Pk and the wait time is eliminated altogether at the processing chamber Pk during each time block corresponding to the reference transfer interval Tx. It is to be noted that the reference transfer interval Tx, the wafer transfer ratio and the like determined through the processing shown in FIG. 3 are stored into the memory or the like at the control unit 190.

(Specific Example of Alternative Processing Executed to Determine Wafer Transfer Frequencies)

Next, in reference to FIG. 10, a specific example of the alternative processing that may be executed to determine the wafer transfer frequencies is explained. In this example, the wafer transfer frequencies with which the wafers $W_{P1}$ and $W_{Pk}$ are to be actually transferred from the cassette containers 134 are determined based upon the wafer transfer ratio corresponding to the reference transfer interval Tx selected through the processing in FIG. 9 executed to determine the wafer transfer ratio.

In even more specific terms, the wafer transfer ratio ($W_{P1}:W_{Pk}$) having been determined through the processing in FIG. 9 is extracted from the memory at the control unit 190 and a decision is made as to whether the wafer transfer ratio ($W_{P1}:W_{Pk}$) is m:n or m:n+1 in step S510 as shown in FIG. 10.

If it is decided in step S510 that the wafer transfer ratio ($W_{P1}:W_{Pk}$) is m:n, the wafer transfer frequency for the wafers $W_{P1}$ to be processed at the processing chamber P1 is set so $W_{P1}$ to be processed at the processing chamber P1 is set so that n wafers $W_{P1}$ are transferred during each time block corresponding to the reference transfer interval Tx at the rate of one wafer $W_{P1}$ per processing time $T_{P1}$ in step S520. As a result, m wafers $W_{P1}$ are continuously transferred from the cassette container 134 during each time block corresponding to the reference transfer interval Tx. Since the reference transfer interval Tx is equal to the processing time $T_{P1} \cdot m$ at the processing chamber P1, m wafers $W_{P1}$ are continuously processed with no wait time at the processing chamber P1 during each time block corresponding to the reference transfer interval Tx.

Next, in step S530, the wafer transfer frequency for the wafers $W_{Pk}$ to be processed at the processing chamber Pk is set so that n wafers $W_{Pk}$ are transferred during each time block corresponding to the reference transfer interval Tx, at the rate one wafer $W_{Pk}$ transferred per processing time $T_{Pk}$. As a result, n wafers $W_{Pk}$ are continuously transferred from the cassette container 134 and then the wait time $T_{Wk}$ during which the operation waits in standby for the next transfer ensues in each time block corresponding to the reference transfer interval Tx. In other words, after n wafers have been transferred continuously from the cassette container 134, the operation waits over the wait time $T_{Wk}$ before the next set of n wafers is continuously transferred from the cassette container 134. In this case, the reference transfer interval Tx matches the sum of the processing time $T_{Pk} \cdot n$ and the wait time $T_{Wk}$ at the processing chamber Pk. Accordingly, n wafers $W_{Pk}$ are continuously processed and then the wait time $T_{Wk}$ ensues at the processing chamber Pk during each time block corresponding to the reference transfer interval Tx.

If, on the other hand, it is judged in step S510 that the wafer transfer ratio ($W_{P1}:W_{Pk}$) is m:n+1, the wafer transfer frequency for the wafers $W_{P1}$ to be processed at the processing chamber P1 is set so that m wafers $W_{P1}$ are transferred during each time block corresponding to the reference transfer interval Tx at the rate of one wafer per processing time $T_{P1}$ in step S540. As a result, m wafers $W_{P1}$ are transferred from the cassette container 134 and then a transfer wait time equal to $T_{W1}$ ensues during each time block corresponding to the reference transfer interval Tx. Namely, after m wafers are transferred from the cassette container 134 the wait time $T_{W1}$ ensues in each time block corresponding to the processing time $T_{P1}$, and then the next set of m wafers $W_{P1}$ is continuously transferred from the cassette container 134. In this case, the reference transfer interval Tx matches the sum of the processing time $T_{P1} \cdot m$ and the wait time $T_{W1}$ at the processing chamber P1 and accordingly, m wafers $W_{P1}$ are continuously processed and then the wait time $T_{W1}$ ensues at the processing chamber P1 during each time block corresponding to the reference transfer interval Tx.

Next, in step S550, the wafer transfer frequency for the wafers $W_{Pk}$ to be processed at the processing chamber Pk is set so that n+1 wafers $W_{Pk}$ are transferred during each time block corresponding to the reference transfer interval Tx at the rate of one wafer $W_{Pk}$ transferred per processing time $T_{Pk}$. As a result, n+1 wafers $W_{Pk}$ are continuously transferred from the cassette container 134 during each time block corresponding to the reference transfer interval Tx. In this case, the reference transfer interval Tx matches the processing time $T_{Pk} \cdot (n+1)$ at the processing chamber Pk and accordingly, n+1 wafers $W_{Pk}$ are continuously processed at the processing chamber Pk with no wait time during each time block corresponding to the reference transfer interval Tx.

The wafer transfer ratio and the wafer transfer frequencies determined through the processing shown in FIGS. 9 and 10 are stored by the control unit 190 into its memory or the like. The control unit 190 retrieves the wafer transfer ratio and the wafer transfer frequencies determined through the processing in FIGS. 9 and 10 from the memory or the like for the actual wafer processing, controls the transfer unit-side transfer mechanism 170 based upon the wafer transfer ratio and the wafer transfer frequencies thus retrieved and transfers the wafers $W_{P1}$ and $W_{Pk}$ from the cassette containers 134.

Thus, the wafers $W_{P1}$ processed at the processing chamber P1 where the wafer processing takes a longer time are transferred from the cassette container 134 over a longer time interval in correspondence to the processing time $T_{P1}$, whereas the wafers $W_{Pk}$ processed at the processing chamber Pk where wafers can be processed quickly are transferred from the wafer container over a shorter time interval corresponding to the processing time $T_{Pk}$. As a result, wafers $W_{P1}$ intended for the processing chamber P1 with the greater processing time are not kept in standby over an extended time of time at the common transfer chamber 150, the load-lock chamber 160M or 160N, the orienter 137 and the like to hold up the transfer of wafers $W_{Pk}$ for the processing chamber $T_{Pk}$ with the shorter processing time from the cassette container 134. Consequently, the operation rates at the individual processing chambers P1 and Pk are improved and the throughput of the substrate processing apparatus can be improved over the prior art.

In addition, the wafers $W_{P1}$ and $W_{Pk}$ are transferred from the cassette containers 134 with the timing (cycle) corresponding to the uniform reference transfer interval Tx and, accordingly, the time blocks each corresponding to the reference transfer interval Tx, during which the wafers $W_{P1}$ and $W_{Pk}$ are transferred, are offset by an extent matching the time lag $T_{Sk}$ between the time point at which the first wafer $W_{P1}$ to be processed is transferred and the time point at which the first wafer $W_{Pk}$ to be processed is transferred. For this reason, the transfer timing for the wafers $W_{P1}$ and the transfer timing for the wafers $W_{Pk}$ never coincide. It is to be noted that the processing shown in FIGS. 9 and 10 can be adopted when the processing time $T_{P1}$ at the processing chamber P1 is exactly an integral multiple of the processing time $T_{Pk}$ at the processing chamber Pk, as well as when the processing time $T_{P1}$ at the processing chamber P1 is not exactly an integral multiple of the processing time $T_{Pk}$ at the processing chamber Pk.

The processing executed to determine the transfer timing as shown in FIGS. 2, 9 and 10 for the substrate processing apparatus 200 in FIG. 6 with four processing chambers is explained by quoting specific numerical values. FIG. 11 shows the processing schedules for wafers to be processed in the individual processing chambers with the transfer timing determined as shown in FIGS. 2, 9 and 10. In FIG. 11, time is indicated along the horizontal axis and the processing schedules for the wafers processed in the four processing chambers P1, P2, P3 and P4 are each indicated in a bar graph. In the example presented in FIG. 11, it takes 100 sec, 70 sec, 60 sec and 50 sec to process a single wafer in the processing chambers 140A, 140B, 140C and 140D respectively.

In this example, the processing chamber with the longest processing time is the processing chamber 140A and accordingly, the processing chamber 140A is designated as the processing chamber P1 with the processing time $T_{P1}$, the processing chamber 140B is designated as the processing chamber P2 with the processing time $T_{P2}$, the processing chamber 140C is designated as the processing chamber P3 with the processing time $T_{P3}$ and the processing chamber 140D is designated as the processing chamber P4 with the processing time $T_{P4}$ through the processing executed in steps S110 and S120 in FIG. 2. Under these circumstances, the transfer timing for the wafers $W_{P1}$ and $W_{P2}$ is determined based upon the relationship between the processing chambers P1 and P2, the transfer timing for the wafers $W_{P3}$ is determined based upon the relationship between the processing chambers P1 and P3, and the transfer timing for the wafers $W_{P4}$ is determined based upon the relationship between the processing chambers P1 and P4. However, the uniform reference transfer interval Tx selected when determining the transfer timing for the wafers $W_{P1}$ and $W_{P2}$ is also used when determining the transfer timing for the wafers $W_{P3}$ and the transfer timing for the wafers $W_{P4}$. The specific method adopted to determine such wafer transfer timing is now explained in detail.

First, based upon the relationship between the processing chamber P1 and the processing chamber P2, the transfer timing for the wafers $W_{P1}$ and $W_{P2}$ is determined. Namely, through the processing executed in steps S410 through S440 in FIG. 9, the values of m and n that set the wait time $T_{Wk}$ and $T_{W1}$ to the least lengths are determined to be 2 and 3 respectively. Then, through the processing executed in steps S450 through S470, the processing time 70 sec×3 (=210 sec) at the processing chamber P2 is selected as the reference transfer interval Tx for the wafers $W_{P1}$ and $W_{P2}$ and the wafer transfer ratio ($W_{P1}$:$W_{P2}$) for the wafers $W_{P1}$ and $W_{P2}$ is set to 2:3. The wafer transfer frequency for the wafers $W_{P1}$ is set so that two wafers $W_{P1}$ are transferred during each time block corresponding to the reference transfer interval Tx (=210 sec) at the rate of one wafer per processing time $T_{P1}$ (=100 sec), whereas the wafer transfer frequency for the wafers $W_{P2}$ is set so that three wafers $W_{P2}$ are transferred during each time block corresponding to the reference transfer interval Tx (=210 sec) at the rate of one wafer per processing time $T_{P2}$ (=70 sec).

Next, the transfer timing for the wafers $W_{P3}$ to be processed at the processing chamber P3 is determined based upon the relationship between the processing chambers P1 and P3. Since the reference transfer interval Tx of 210 sec already selected, the transfer timing for the wafers $W_{P3}$ is calculated based upon this reference transfer interval. This processing is executed as has been explained in reference to FIG. 8. Accordingly, the wafer transfer ratio ($W_{P1}$:$W_{P3}$) of the wafers $W_{P1}$ to be processed at the processing chamber P1 and the wafers $W_{P3}$ to be processed at the processing chamber P3 is set to 1:3 and the wafer transfer frequency is set for the wafers $W_{P3}$ so that three wafers $W_{P3}$ are transferred during each time block corresponding to the reference transfer interval Tx (=210 sec) at the rate of one wafer per processing time $T_{P3}$ (=60 sec).

Next, the transfer timing for the wafers $W_{P4}$ to be processed at the processing chamber P4 is determined based upon the relationship between the processing chambers P1 and P4. Since the reference transfer interval Tx of 210 sec already selected, the transfer timing for the wafers $W_{P4}$ is also calculated based upon this reference transfer interval. This processing is executed as has been explained in reference to FIG. 8. Accordingly, the wafer transfer ratio ($W_{P1}$:$W_{P4}$) of the wafers $W_{P1}$ to be processed at the processing chamber P1 and the wafers $W_{P4}$ to be processed at the processing chamber P4 is set to 1:4 and the wafer transfer frequency is set for the wafers $W_{P4}$ so that four wafers $W_{P4}$ are transferred during each time block corresponding to the reference transfer interval Tx (=210 sec) at the rate of one wafer per processing time $T_{P4}$ (=50 sec).

As the individual wafers $W_{P1}$, $W_{P2}$, $W_{P3}$ and $W_{P4}$ are transferred from the cassette containers 134 with the wafer transfer timing determined as described above, the wafers are processed at the processing chambers P1, P2, P3 and P4 as indicated in the processing schedules presented in FIG. 11. In this case, two wafers $W_{P1}$ are continuously processed and then the wait time $T_{W1}$ (=10 sec) ensues at the processing chamber P1 during each time block corresponding to the reference transfer interval Tx (=210 sec), three wafers $W_{P2}$ are continuously processed with no wait time at the processing chamber P2 during each time block corresponding to the reference transfer interval Tx, three wafers $W_{P3}$ are continuously processed and then the wait time $T_{W3}$ (=30 sec) ensues at the processing chamber P3 during each time block corresponding to the reference transfer interval Tx and four wafers $W_{P4}$ are continuously processed and the wait time Tw4 (=10 sec) ensues at the processing chamber P4 during each time block corresponding to the reference transfer interval Tx.

As explained in detail above, the wafers $W_{P1}$ and $W_{Pk}$ are transferred from the cassette containers 134 with the wafer transfer timing determined in advance in correspondence to the individual processing chambers P1 and Pk based upon the lengths of time $T_{P1}$ and $T_{Pk}$ required to process wafers $W_{P1}$ and $W_{Pk}$ at the processing chambers P1 and Pk. Thus, the timing with which wafers are transferred from the cassette containers 134 to the individual processing chambers P1 and Pk to undergo concurrent wafer processing can be optimized in coordination with the lengths of processing time $T_{P1}$ and $T_{Pk}$ at the processing chambers P1 and Pk. For instance, wafers $W_{P1}$ to be processed at the processing chamber P1 where the processing time is significant are transferred from the cassette container 134 over a long time interval corresponding to the processing time $T_{P1}$, whereas the wafer $W_{Pk}$ to be processed at the processing chamber Pk where the processing is completed quickly are transferred from the wafer container over a shorter time interval in correspondence to the processing time $T_{Pk}$.

As a result, wafers $W_{P1}$ intended for the processing chamber P1 with the greater processing time are not kept in standby over an extended time of time at the common transfer chamber 150, the load-lock chamber 160M or 160N, the orienter 137 and the like to hold up the transfer of wafers $W_{Pk}$ for the processing chamber $T_{Pk}$ with the shorter processing time from the cassette container 134. Consequently, the operation rates at the individual processing chambers P1 and Pk are improved and the throughput of the substrate processing apparatus is also improved over the prior art.

It is to be noted that the processing for determining the wafer transfer timing achieved in the embodiments described above is executed prior to the actual wafer processing. It may be executed, for instance, as part of the warmup processing after the power to the substrate processing apparatus is turned on. In addition, the processing may be executed after the maintenance work is executed for the substrate processing apparatus to replace parts or clean the parts.

Furthermore, the wafer transfer timing is determined in correspondence to the lengths of processing time required at the individual processing chambers in the embodiments. This means that if the wafer transfer timing needs to be determined prior to the actual wafer processing, the timing must be ascertained based upon estimated values for the required length of processing time at the individual processing chambers. It is conceivable that the lengths of the actual wafer processing time do not match the estimated values, depending upon the states of the processing environments such as adherence of particles inside the processing chambers. Also, even during a single processing sequence, some of the basic processing conditions (e.g., parameters such as the processing chamber internal pressure, the temperature, the flow rate ratio of constituents of the processing gas and the voltage applied to the electrodes) may need to be altered or an additional processing condition (a parameter or the like) may need to be introduced. Under such circumstances, too, the actual length of processing time may deviate from the corresponding estimated value.

If the processing time at a given processing chamber deviates from its estimated value, the wafer transfer timing should be re-determined. By calculating the wafer transfer timing in correspondence to the lengths of the actual processing time at the individual processing chambers in this manner, the occurrence of an unexpected wait time attributable to a deviation between the estimated value and the actual length of processing time at each processing chamber can be prevented.

For instance, while the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

While an explanation is given above in reference to the embodiments on an example in which the present invention is adopted in a so-called cluster tool type substrate processing apparatus that includes a processing unit having a plurality of processing chambers connected around a common transfer chamber, the present invention may be adopted in any of various other types of substrate processing apparatuses in which processing is executed concurrently in a plurality of processing chambers, including a so-called tandem type substrate processing apparatus that includes a plurality of processing units, each having a processing chamber connected to a load-lock chamber connected in parallel to a transfer unit.

What is claimed is:

1. A substrate processing method adopted in a substrate processing apparatus that processes a plurality of substrates concurrently in a plurality of processing chambers by sequentially transferring said substrates contained in a substrate storage container with transfer timing determined in advance to said processing chambers where said substrates are to undergo processing, wherein said transfer timing is determined through:
   a step for calculating a substrate transfer ratio of the number of substrates transferred in correspondence to each of said processing chambers during a single block corresponding to a reference transfer interval, the length of which is determined based upon the lengths of processing time required to process the substrates in said processing chambers; and
   a step for calculating a substrate transfer frequency for each processing chamber based upon said substrate transfer ratio.

2. A substrate processing method adopted in a substrate processing apparatus according to claim 1, wherein:
   said step for calculating said substrate transfer ratio includes:
   a step for determining the maximum number n of substrates that can be processed in another processing chamber during a single time block corresponding to a reference transfer interval matching the length of time required to process a single substrate in a processing chamber requiring the longest processing time among said processing chambers,
   a step for determining the length of wait time to occur in said other processing chamber during the time block corresponding to said reference transfer interval matching the length of time required to process a single substrate in said processing chamber requiring the longest processing time,
   a step for determining the length of wait time to occur in said processing chamber requiring the longest processing time during a time block corresponding to a reference transfer interval block matching the length of time required to process n+1 substrates in said other processing chamber, and a step for comparing the lengths of wait time, selecting the length of time required to process a single substrate in said processing chamber requiring the longest processing time as said reference transfer interval and setting said substrate transfer ratio to 1:n if the length of wait time at said processing chamber requiring the longest processing time is equal to or less than the length of wait time at said other processing chamber, and selecting the length of time required to process n+1 substrates in said other processing chamber as said reference transfer interval and setting said substrate transfer ratio to 1:n+1 if the length of wait time at said processing chamber requiring the longest processing time is greater than the length of wait time at said other processing chamber; and said step for determining said substrate transfer frequency includes:

a step for setting said substrate transfer frequency for said processing chamber requiring the longest processing time so as to transfer a single substrate during a time block corresponding to said reference transfer interval and setting said substrate transfer frequency for said other processing chamber so as to transfer n substrates during a time block corresponding to said reference transfer interval at a rate of one substrate per processing time thereat if said substrate transfer ratio is 1:n and for setting said substrate transfer frequency for said processing chamber requiring the longest processing time so as to transfer a single substrate during a time block corresponding to said reference transfer interval and setting said substrate transfer frequency for said other processing chamber so as to transfer n+1 substrates during a time block corresponding to said reference transfer interval at a rate of one substrate per processing time thereat if said substrate transfer ratio is 1:n+1.

3. A substrate processing method adopted in a substrate processing apparatus according to claim 1, wherein:

said step for determining said substrate transfer ratio executed includes:

a step for calculating the maximum number n of substrates that can be processed in another processing chamber during a single time block corresponding to a reference transfer interval matching the length of time required to process m substrates in a processing chamber requiring the longest processing time among said processing chambers, a step for determining the length of wait time to occur at said other processing chamber during the time block corresponding to said reference transfer interval matching the length of time required to process m substrates in said processing chamber requiring the longest processing time, a step for determining the length of wait time to occur in said processing chamber requiring the longest processing time during a time block corresponding to a reference transfer interval matching the length of time required to process n+1 substrates in said other processing chamber, a step for ascertaining values representing the maximum number n of substrates, the length of wait time at said other processing chamber and the length of wait time at said processing chamber requiring the longest processing time in correspondence to each of varying values of m and determining values for m and n that will minimize the lengths of wait time at said other processing chamber and at said processing chamber requiring the longest processing time, and a step for comparing the length of wait time at said other processing chamber and the length of wait time at said processing chamber requiring the longest processing time in correspondence to the values determined for m and n, selecting the length of time required to process m substrates in said processing chamber requiring the longest processing time as said reference transfer interval and setting said substrate transfer ratio to m:n+1 if the length of wait time at said processing chamber requiring the longest processing time is equal to or less than the length of wait time at said other processing chamber, and selecting the length of time required to process n+1 substrates in said other processing chamber as said reference transfer interval and setting said substrate transfer ratio to m:n+1 if the length of wait time at said processing chamber requiring the longest processing time is greater than the length of wait time at said other processing chamber; and said step for determining said substrate transfer frequency includes:

a step for setting said substrate transfer frequency for said processing chamber requiring the longest processing time so as to transfer m substrates during a time block corresponding to said reference transfer interval at a rate of one substrate per processing time thereat and setting said substrate transfer frequency for said other processing chamber so as to transfer n substrates during a time block corresponding to said reference transfer interval at a rate of one substrate per processing time thereat if said substrate transfer ratio is m:n, and for setting said substrate transfer frequency for said processing chamber requiring the longest processing time so as to transfer m substrates during a time block corresponding to said reference transfer interval at a rate of one substrate per processing time thereat and setting said substrate transfer frequency for said other processing chamber so as to transfer n+1 substrates during a time block corresponding to said reference transfer interval at a rate of one substrate per processing time thereat if said substrate transfer ratio is m:n+1.

4. The substrate processing method adopted in a substrate processing apparatus according to claim 1, wherein:

said substrate transfer ratio is calculated based upon a maximum number of substrates that can be processed in each processing chamber during the single time block corresponding to the reference transfer interval, the length of which is determined in correspondence to lengths of time required to process the substrates in said processing chamber, and the substrates are transferred to said processing chamber in a quantity indicated in said substrate transfer ratio during the single time block corresponding to said reference transfer interval at a rate of one substrate per processing time in said processing chamber.

5. The substrate processing method adopted in a substrate processing apparatus according to claim 4, wherein:

said substrate transfer ratio is determined based upon a maximum number of substrates that can be processed in another processing chamber during a single time block corresponding to a reference transfer interval matching a length of processing time at said processing chamber where the processing is executed over a longest time of times among said processing chambers requiring varying lengths of processing time.

6. The substrate processing method adopted in a substrate processing apparatus according to claim 4, wherein:
said reference transfer interval is selected so as to minimize a length of wait time occurring during the single time block corresponding to said reference transfer interval at each processing chamber.

* * * * *